(12) United States Patent
Han et al.

(10) Patent No.: US 7,936,595 B2
(45) Date of Patent: May 3, 2011

(54) CLOSE SHAPED MAGNETIC MULTI-LAYER FILM COMPRISING OR NOT COMPRISING A METAL CORE AND THE MANUFACTURE METHOD AND THE APPLICATION OF THE SAME

(75) Inventors: Xiufeng Han, Beijing (CN); Ming Ma, Beijing (CN); Qihang Qin, Beijing (CN); Hongxiang Wei, Beijing (CN); Lixian Jiang, Beijing (CN); Yunan Han, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 222 days.

(21) Appl. No.: 12/159,657

(22) PCT Filed: Dec. 31, 2006

(86) PCT No.: PCT/CN2006/003799
§ 371 (c)(1),
(2), (4) Date: Sep. 24, 2008

(87) PCT Pub. No.: WO2007/076718
PCT Pub. Date: Jul. 12, 2007

(65) Prior Publication Data
US 2009/0168506 A1 Jul. 2, 2009

(30) Foreign Application Priority Data

Dec. 31, 2005 (CN) .......................... 2005 1 0135365
Dec. 31, 2005 (CN) .......................... 2005 1 0135370
Jan. 9, 2006 (CN) .......................... 2006 1 0000191
Jan. 11, 2006 (CN) .......................... 2006 1 0011166
Jan. 11, 2006 (CN) .......................... 2006 1 0011167
Jan. 11, 2006 (CN) .......................... 2006 1 0011168

(51) Int. Cl.
*G11C 11/14* (2006.01)
(52) U.S. Cl. ............ 365/171; 365/158; 365/66; 365/55; 365/173; 365/225.5; 257/421
(58) Field of Classification Search .................. 365/171, 365/158, 66, 55, 173, 225.5; 257/421
See application file for complete search history.

(56) References Cited

U.S. PATENT DOCUMENTS 5,541,868 A * 7/1996 Prinz .............................. 365/98
2003/0123280 A1 * 7/2003 Brown .......................... 365/158
(Continued)

FOREIGN PATENT DOCUMENTS
CN 1381909 11/2002
CN 1617257 5/2005

*Primary Examiner* — Son Dinh
*Assistant Examiner* — Toan Le
(74) *Attorney, Agent, or Firm* — Connolly Bove Lodge & Hutz LLP

(57) ABSTRACT

Each layer in the magnetic multilayer film is a closed ring or oval ring and the magnetic moment or flux of the ferromagnetic film in the magnetic unit is in close state either clockwise or counterclockwise. A metal core is put in the geometry center position in the close-shaped magnetic multilayer film. The cross section of the metal core is a corresponding circular or oval. A MRAM is made of the closed magnetic multilayer film with or without a metal core. The close-shaped magnetic multilayer film is formed by micro process method. The close-shaped magnetic multilayer film can be used broadly in a great variety of device that uses a magnetic multilayer film as the core, such as MRAM, magnetic bead in computer, magnetic sensitive sensor, magnetic logic device and spin transistor.

29 Claims, 8 Drawing Sheets

U.S. PATENT DOCUMENTS

2004/0166640 A1 * 8/2004 Yagami et al. ................ 438/277

2004/0213039 A1 * 10/2004 Kawabata et al. ............ 365/158

* cited by examiner

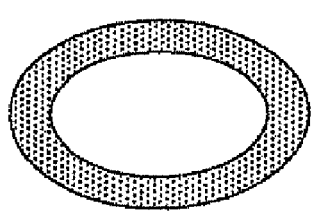
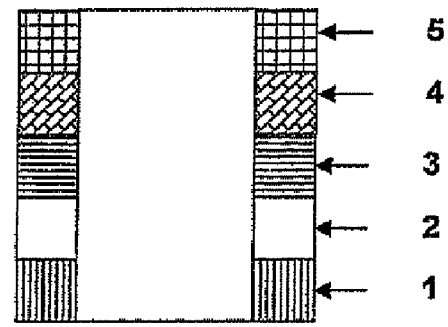
Fig. 1-1     Fig. 1-2
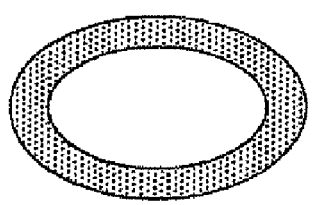
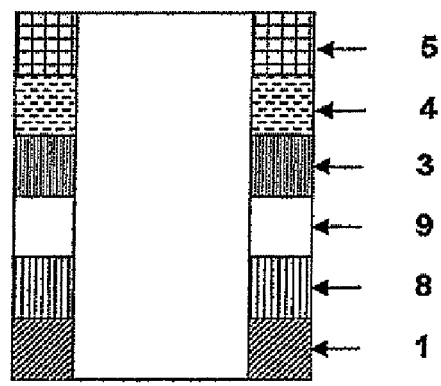
Fig. 2-1     Fig. 2-2
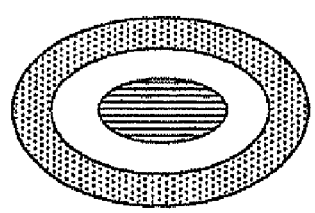
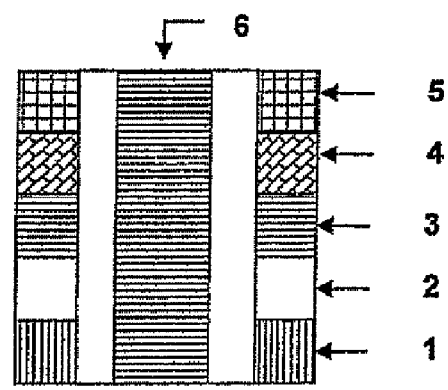
Fig. 3-1     Fig. 3-2

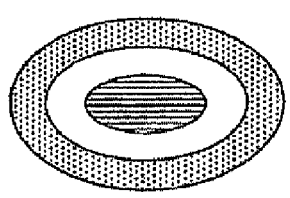
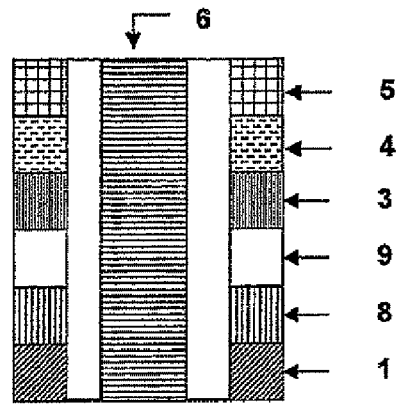
Fig. 4-1    Fig. 4-2
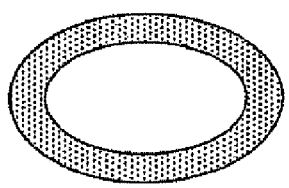
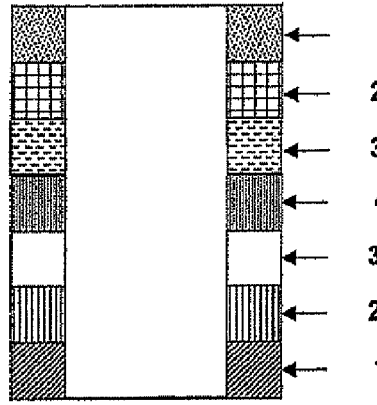
Fig. 5-1    Fig. 5-2
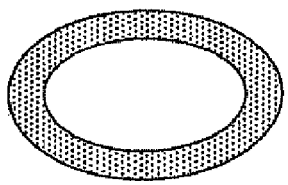
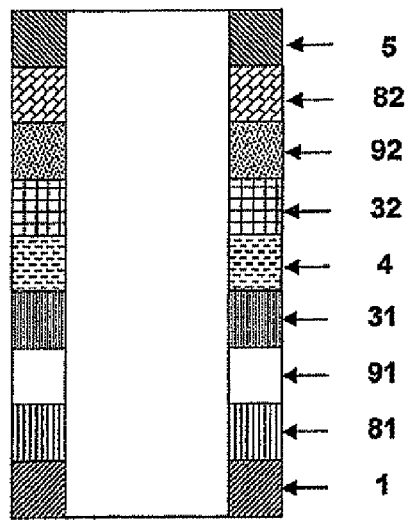
Fig. 6-1    Fig. 6-2

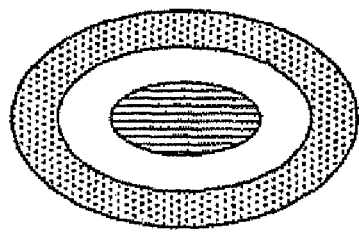
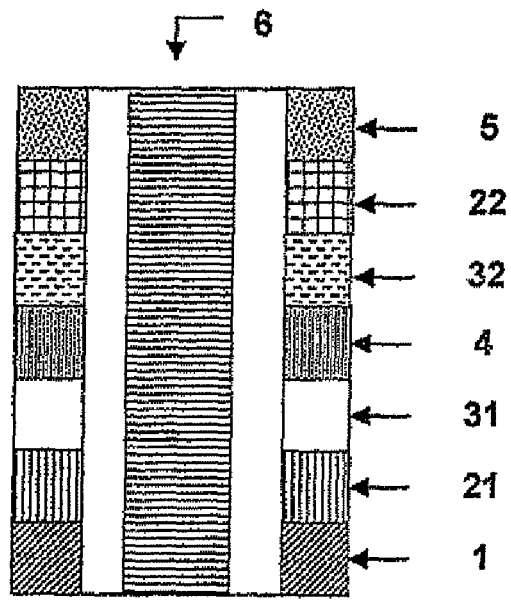
Fig. 7-1     Fig. 7-2
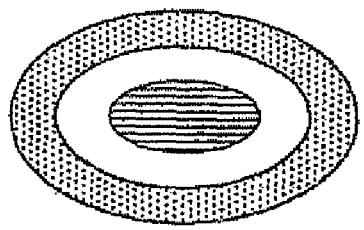
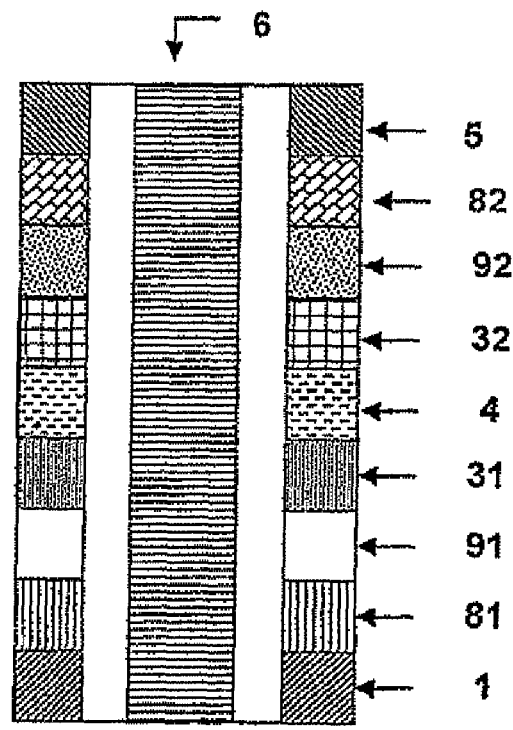
Fig. 8-1     Fig. 8-2

CLOSE SHAPED MAGNETIC MULTI-LAYER FILM COMPRISING OR NOT COMPRISING A METAL CORE AND THE MANUFACTURE METHOD AND THE APPLICATION OF THE SAME

TECHNICAL FIELD

The present invention relates to a close shaped magnetic multilayer film, a close shaped magnetic multilayer film with a metal core, and the preparation method thereof, and to a magnetic random access memory based on above closed-shape magnetic multilayer films and its control method thereof.

BACKGROUND OF THE INVENTION

Since the end of 1980s, when Baibich et al discovered the Giant magneto Resistance (GMR) in a magnetic multilayer film system for the first time, the research of magnetic multilayer film system has gain wide attention from scientific researchers. Since GMR effect has very high magnetoresistance ratio, it can be widely applied in areas such as magnetoresistance type sensors, magnetic recording read head etc. The devices based on the GMR effect are not only with excellent characters such as high sensitivity, small volume, and low power consumption etc., but also bring many new characters such as anti-radiation, nonvolatile information storage etc. Especially the application of GMR effect into magnetic recording read head has brought a profound revolution to the entire information recording area, and has produced direct and far-reaching effect to related industries. In 1994, IBM developed read head for hard disk utilizing GMR effect, which increased the recording density of the magnetic disk storage system nearly 20 times, which is a breakthrough for the computer industry; the design of various sensory devices based on GMR effects are greatly simplified due to the increase of output signals, which directly leads to the miniaturization and cheapness of the devices.

After the discovery of GMR effect, in 1995, a Japanese scientist T. Miyazaki and a U.S.A. scientist J. S. Moodera acquired a Tunneling Magneto Resistance (TMR) ratio of 18% and 10% at room temperature in a Magnetic Tunnel Junction (MTJ), respectively, which generated the research heat of MTJ. The researchers, based on GMR effect and MTJ, have designed a device model of a new type of Magnetic Random Access Memory (MRAM), which, due to totally new designs, has many new exciting features, such as anti-radiation, non-volatile information storage etc. In a typical design of MRAM device, the core structure includes four parts: bit line, word line, read line and memory cell. The bit line and word line, read line are positioned above and below the memory cell respectively, crossing each other, and the memory cells are located at the cross section of bit lines and word lines. The writing procedures of MRAM are completed by the reverse of magnetic moment of the bit layer, which is driven by the combined magnetic field co-produced by the two pulse currents flowing through the word line and the bit line. Therefore, such working way depends obviously on an intermediate step, the magnetic field produced by the two pulse current of word line and bit line, to control the magnetic states of a memory cell, which makes the structure and reparation process very complicated, and cause great inconvenience and pretty high cost to the processing and integration of MRAM devices.

In 1996, a U.S.A. scientist J. Slonczewski predicted a new physical mechanism—Spin Torque (ST) effect, theoretically, which utilizes current itself to realize the control of magnetic states of a memory cell. When the current flowing through a memory cell is lower than certain specific threshold value $I_c$, the magnetic states of the memory cell will not be changed by the current flowing through the memory cell, by which the read operation can be realized; when the current flowing through a memory cell is higher than the threshold value Ic, the magnetic states of the memory cell is determined by the direction of the current flowing through the memory, by which the write operation can be realized. For the next more than ten years, scientists have conducted large amount of open and deep research of this new effect. If the new mechanism can be applied into devices such as magnetic multilayer system and MRAM, the device structure and processing technique will be greatly simplified, leading to another revolutionary breakthrough for the area of information storage.

However, because the geometry structure of the memory cells used in prior art—such as bit layer (soft magnetic layer) and other pinned magnetic layer (or hard magnetic layer)—has adopted non-close structure such as rectangle, eclipse, etc. This kind of structure brings relatively larger demagnetization field and shape anisotropy in a memory cell with high density and small scale, which, beyond all doubt, increases the adverse field (coercive force) and power consumption of the bit layer (soft magnetic layer). At the same time, the magnetic coupling and interferences among memory cells are unavoidable in the high density state, which bring many disadvantageous effects and magnetic noises to the uniformity and consistency of the electromagnetic features of the memory cells, and also the complexity of the structure and processing techniques to the design and fabrication of the memory cells. Currently, to decrease the demagnetization field, the MTJ is used as a memory cell, the upper and lower magnetic electrode of which have adopted the bit layer and bottom pinning layer of manual pinning compound type with sandwich style (e.g. Co—Fe/Ru/Co—Fe—B and Py/Ru/Co—Fe—B). However, the adverse field and power consumption of its bit layer fails to lower to a perfect and desired minimum value. To overcome these problems, new geometry structures and principle for designing a device should be adopted to eliminate the demagnetization field produced by the memory cells themselves when the magnetic multilayer has experienced down scale patterning of micro-fabrication and nano-fabrication, and to further decrease the shape anisotropy of bit layers of the memory cells.

SUMMARY OF THE INVENTION

The object of present invention is to overcome the defect of the physical structure of conventional magnetic multilayer film system, and to provide a close shaped magnetic multilayer film having no demagnetization field and weak shape anisotropy by changing the geometry structure of a multilayer film system.

Another object of the present invention is to overcome the defect of the physical structure of conventional magnetic multilayer film system, and to provide a close shaped magnetic multilayer film with a metal core and having no demagnetization field and weak shape anisotropy by changing the geometry structure of a multilayer film system.

Still another object of present invention is to provide a close shaped magnetic multilayer film and the preparation method of a close shaped magnetic multilayer film with a metal core.

Yet another object of present invention is to overcome that when the magnetic random access memory in prior art uses magnetic multilayer film of unclosed structure as memory cell, some technical problems and defects are generated in the operation method of both reading and writing of RAM due to the effects of demagnetization field and shape anisotropy of memory cell with unclosed structure and also due to the magnetic coupling and interference among magnetic memory cells in a high density state, and to provide a magnetic multilayer film based on the above closed shape, a close shaped magnetic multilayer film with a metal core, a magnetic random access memory which can eliminate the demagnetization field of memory cells, lower its shape anisotropy and magnetic interaction and interference, and the control method thereof.

The objects of present invention are achieved by the following technical solutions:

The magnetic multilayer film system described by the present invention includes a normal magnetic multilayer film that is deposited on a substrate first. Then above magnetic multilayer film is patterned by micro-fabrication method, where each unit of a magnetic multilayer film presents a closed ring including both circular and elliptic. Therefore the magnetic moment or flux of each ferromagnetic film in the magnetic cells can form a closed state either clockwise or counter-clockwise. Preferably, the internal diameter of the circular ring is 10-100000 nm, the external diameter is 20-200000 nm, the width of the ring is between 10-100000 nm. Preferably, the minor axis of the internal elliptic ring is 10-100000 nm, the ratio of minor axis vs major axis is 1:1.1-1:5, and the minor axis of the external elliptic ring is 20-200000 nm, and the width of the ring is between 10-100000 nm.

The close shaped magnetic multilayer film with a metal core provided by present invention is the one which further includes a metal at the geometric center of the above close shaped magnetic multilayer film. The cross section of the metal core is either circular or elliptic, wherein the radius of circular metal core is 5-50000 nm; the minor axis of elliptic metal core is 5-50000 nm; the ratio of minor axis vs major axis of the ellipse is 1:1.1-1:5. The shape of the metal core matches with that of the close shaped magnetic multilayer film For example, if the shape of a patterned magnetic multilayer film is a circular ring, so is the shape of the metal core, and if the shape of a patterned magnetic multilayer film is a elliptic ring, then the shape of the metal core is a elliptic ring as well.

The materials of said metal core are made of low-resistance metal materials, preferably Au, Ag, Pt, Ta, W, Ti, Cu, Al, or Si—Al alloy such SiAl, et al. The function of the metal core is to apply current from exterior to proceed with the reading and writing operation of the magnetic multilayer film memory cells more conveniently, and to avoid the possible damage to the potential barrier when carrying out writing operation repeatedly with relatively larger pulse writing current (current transfer atomic effect), via control of the magnetic state of the patterned magnetic multilayer film of memory cells with the circular magnetic field.

In the technical solutions of the present invention, according to the materials, said close shaped magnetic multilayer film with or without a metal core can both be categorized into non-pinning, pinning, and double intermediate layers.

The non-pinning type close shaped magnetic multilayer film, as shown in FIG. 1 and FIG. 3, includes, in turn, a buffering conductive layer (SL) 1, a hard ferromagnetic layer (HFM) 2, an intermediate layer (I) 3, a soft ferromagnetic layer (SFM) 4, and a cover layer (CL) 5.

The pinning type close shaped magnetic multilayer film, as shown in FIG. 2 and FIG. 4, includes, in turn, a buffering conductive layer (SL) 1, an anti-ferromagnetic pinning layer (AFM) 8, a pinned magnetic layer (FM) 9, an intermediate layer (I) 3, a soft ferromagnetic layer (FM), and a cover layer (CL).

The non-pinning type close shaped magnetic multilayer film with double intermediate layers, as shown in FIG. 5 and FIG. 7, includes, in turn, a buffering conductive layer (SL) 1, a first hard ferromagnetic layer (HFM1) 21, a first intermediate layer (I1) 31, a soft ferromagnetic layer (SFM) 4, a second intermediate layer (I2) 32, a second hard ferromagnetic layer (HFM2) 22, and a cover layer (CL) 5.

The pinning type close shaped magnetic multilayer film with double intermediate layers, as shown in FIG. 6 and FIG. 8, includes, in turn, a buffering conductive layer (SL) 1, a first anti-ferromagnetic pinning layer (AFM1) 81, a first pinned ferromagnetic layer (FM1) 91, a first intermediate layer (I1) 31, a soft ferromagnetic layer (FM) 4, a second intermediate layer (I2) 32, a second pinned ferromagnetic layer (FM2) 92, a second anti-ferromagnetic pinning layer (AFM2) 82, and a cover layer (CL) 5.

In the technical solutions according to present invention:

Said substrate is a typical substrate, such as Si, Si/SiO2, SiC, SiN or GaAs etc, the thickness of which is 0.3-1 mm;

Said bottom buffering conductive layer SL is made of metal materials, preferably Ta, Ru, Cr, Au, Ag, Pt, Ta, W, Ti, Cu, Al or Si—Al alloy etc, the thickness of which is 2-200 nm;

Said hard ferromagnetic layer HFM, first and second hard ferromagnetic layer are composed of materials having large giant magneto resistance, such as Co, Fe, Ni, CoFe, NiFeCo, CoFeB, CoFeSiB, etc, the thickness of which is 2-20 nm;

Said intermediate layer 1, first and second intermediate layer is composed of non-magnetic metal or potential barrier of insulation, wherein the materials of non-magnetic metal layer are, for example, Ti, Zn, ZnMn, Cr, Ru, Cu, V or TiC, the materials for potential barrier of insulation are, for example, $Al_2O_3$, MgO, TiO, ZnO, (ZnMn)O, CrO, VO, or TICO. The thickness of the intermediate layer is 0.5-10 nm;

Said soft ferromagnetic layer is composed of ferromagnetic materials of high spin polarization and low coercive force, which includes Co, Fe, Ni or their metal alloys NiFe, CoFeSiB, NiFeSiB, or non-crystal $Co_{100-x-y}Fe_xB_y$ (0<x<100, 0<y$\leq$20), or Heusler alloy such as $Co_2MnSi$, $Co_2Cr_{0.6}Fe_{0.4}Al$.; the component materials of the soft ferromagnetic layer are preferably $CO_{90}Fe_{10}$, $CO_{75}Fe_{25}$, $CO_{40}Fe_{40}B_{20}$, or $Ni_{79}Fe_{21}$, and the thickness of the soft ferromagnetic layer is 1-20 nm;

Said cover layer CL is composed of metal materials which are hard to be oxidized and have relatively large resistance, preferably, Ta, Cu, Ru, Pt, Ag, Au, Cr, etc or their alloys. The thickness of the cover layer CL is 2-20 nm to protect the materials from being oxidized.

Said anti ferromagnetic pinning layer AFM, first and second anti ferromagnetic pinning layer are all composed of alloys having anti ferromagnetic properties, preferably, IrMn, FeMn, PtMn, CrMn or Pt (Cr, Mn) alloy, the thickness of which is 3-30 nm;

Said pinned ferromagnetic layer FM, first and second pinned ferromagnetic layer are composed of ferromagnetic metals having relative high spin polarization ratio, such as Fe, Co, Ni and their alloy, preferably CoFe alloy, NiFe alloy, non crystal CoFeB alloy, CoFeSiB alloy, etc, and the thickness of which is 2-20 nm;

The method of fabricating said close shaped magnetic multilayer film via micro-fabrication according to present invention includes:

1) Selecting a substrate and cleaning it with conventional method, a bottom buffering conductive layer (the bottom buffering conductive layer will become conductive electrode in the subsequent process) is deposited on the substrate in a conventional film fabrication device (e.g. magnetron sputtering, electron beam evaporation, pulse laser deposition, electro-chemical deposition, molecular beam epitaxy, etc.);

2) The hard ferromagnetic layer HFM, the intermediate layer I1, the soft ferromagnetic layer SFM and the cover layer of the non pinning magnetic multilayer film on the bottom buffering conductive layer are deposited in turn by a conventional film growth method such as magnetron sputtering, electron beam evaporation, pulse laser deposition, electrochemical deposition, molecular beam epitaxy, etc. An in-plane induced magnetic field of 50-5000 Oe is selectively applied when depositing the hard ferromagnetic layer and the soft ferromagnetic layer;

Or the anti ferromagnetic pinning layer AFM, pinned magnetic layer FM1, intermediate layer I2, soft ferromagnetic layer and cover layer of the pinning type magnetic multilayer film on the bottom buffering conductive layer according to present invention are deposited in turn, by a conventional film growth method, such as magnetron sputtering, electron beam evaporation, pulse laser deposition, electro-chemical deposition, molecular beam epitaxy, etc. An in-plane induced magnetic field of 50-5000 Oe is selectively applied when depositing the anti ferromagnetic pinning layer, pinned magnetic layer and soft ferromagnetic layer;

Or the first anti ferromagnetic pinning layer AFM1, first pinned magnetic layer FM1, first intermediate layer I1, soft ferromagnetic layer SFM, second intermediate layer I2, second pinned magnetic layer FM2, second anti ferromagnetic pinning layer AFM2 and cover layer of the magnetic multilayer film with double intermediate layers on the bottom buffering conductive layer according to present invention are deposited in turn by a conventional film growth method, such as magnetron sputtering, electron beam evaporation, pulse laser deposition, electro-chemical deposition, molecular beam epitaxy, etc.;

3) The magnetic multilayer film deposited by step 2) is patterned into a structure of close shaped circular ring or elliptic ring via micro-fabrication techniques and method. the detailed steps of said micro-fabrication techniques include: resist coating and pre-baking, the expose according to the required close shaped pattern (including circular ring and elliptic ring) via the ultra-violet extreme ultra-violet lithography or an electron beam lithography machine, the developing, fixing, post-baking. The magnetic multilayer film is processed into closed shape by ion-etching. Finally, the resist is eliminated by dipping into stripping chemicals.

The stripping process can be a reactive-ion-etching assisted stripping, when necessary;

4) An insulating layer is deposited to bury each closed ring shaped multilayer film with different spaces on the etching-formed close shaped magnetic multilayer film acquired in step 3) via conventional means such as magnetron sputtering, electron beam evaporation, pulse laser deposition, electro-chemical deposition, molecular beam epitaxy, etc.;

The insulating layer is composed of conventional insulation materials, and preferably, is $SiO_2$, $Al_2O_3$, ZnO, TiO, SnO or organic molecular materials (e.g. PVC, PE, PP, etc.), the thickness of which is 100-1000 nm;

5) The insulating layer where closed ring shaped multilayer film is located underneath is etched to expose the buried magnetic multilayer film under the insulation layer via ultra violet, extreme ultra violet lithography or electron beam lithography, and focused ion beam etching or chemical reactive dry-etching or chemical reactive wet-etching to fabricate the close shaped magnetic multilayer film of the present invention;

As to the preparation method of close shaped multilayer film with a metal core, a step 4'), between step 4) and step 5) of the above preparation method of close shaped multilayer film, is included:

4') A metal core at the geometric center of the closed ring shaped multilayer film via micro-fabrication techniques is produced. The cross section of the metal core is a circular ring or ellipse, wherein, the radius of the circular ring shaped metal core or the minor axis of the elliptic metal core is 5-50000 nm, the ratio of minor axis a vs major axis b is a:b=1:1-1:5. The shape of the metal core matches with that of the close shaped magnetic multilayer film. For instance, if the shape of the magnetic multilayer film after patterning is circular ring, then the metal core is a circular ring. However, if the shape of the magnetic multilayer film after patterning is elliptic ring, the metal core is elliptic.

Above micro-fabrication techniques include: locating the geometric center of the closed ring shaped multilayer film, after which the insulation layer being etched via micro-fabrication method such as focused ion beam etching, ultra violet, extreme ultra violet lithography, electron beam lithography, chemical reactive etching, etc. to form a cylindrical hole, the cross section of which is a circular ring or ellipse. Then the metal core is formed by depositing metal materials within the hole via methods such as electrochemical deposition, magnetron sputtering, focused ion beam assisted deposition, etc.;

Said material of metal core is made of low resistivity metal materials, preferably Au, Ag, Pt, Ta, W, Ti, Cu, Al or Si—Al alloys such as SiAl alloy etc.

Before usage, the magnetic multilayer film obtained above has to be further processed to grow electrodes, the detailed steps are:

6) A conductive layer is deposited via conventional film preparation method such as magnetron sputtering, electron beam evaporation, pulse laser deposition, electrochemical deposition, molecular epitaxy, etc.;

Said conductive layer are composed of metals with low resistivity, preferably Au, Ag, Pt, Cu, Al, SiAl, etc. or their metal alloys, the thickness of which is 2-200 nm;

7) Finally, the conductive layer is fabricated into electrodes via conventional micro-fabrication techniques for semiconductor, and each closed ring structure have four electrodes, thus, the device with magnetic multilayer film of present invention is completely done;

Said conventional micro-fabrication techniques for semiconductor include: after resist coating and pre-baking, the substrate is exposed with a mask having desired patterns via ultra violet, extreme ultra violet lithography machine or electron beam lithography machine. Then it moves to the developing, fixing and post-baking, after which the conductive layer on the magnetic multilayer film is etched into the shape of four electrodes via ion etching method. At last, the substrate is dipped into stripping chemicals to eliminate the remaining resist.

The magnetic multilayer film with (or without) a metal core of present invention can be widely used in various devices, such as magnetic random access memories, magnetic read head of computers, magnetic sensors, magnetic logical devices and spin transistors.

Present invention has provided a magnetic random access memory based on close shaped magnetic multilayer film, which utilizes the above close shaped magnetic multilayer film with (or without) a metal core as memory cells.

The magnetic random access memory based on close shaped magnetic multilayer film provided by present invention includes following types:

1. The magnetic random access memory based on the close shaped magnetic multilayer film according to present invention, as shown in FIGS. 9A, 9B and 9C, includes:

Arrays of memory read-write control units constituted by transistor TR unit 0 (including source electrode 0b, drain electrode 0a and light doping region 0c of the transistor), the arrays of read-write control units are integrated in the semiconductor substrate;

Memory cell 65 and the arrays thereof is constituted by memory cells of close shaped magnetic multilayer film (RML), wherein the geometric structure of the memory cell 65 is close-shaped magnetic multilayer film. The close-shaped magnetic multilayer film with a metal core includes non-pinning and pinning, whose characteristics have been described above.

Unit 0 in the above transistor is connected with the transition metal layer (4a, 4b) of the memory cells of close-shaped magnetic multilayer film and with the word line 62, bit line 4c and ground line 4a. The above word line is also the grid electrode of the transistor 0. The bit line BL is disposed above the memory cell 65 of close-shaped magnetic multilayer film, vertical to the word line WL, and is connected directly with the memory cell RML of close-shaped magnetic multilayer film.

Wherein, a first contact conductive hole 3a and a second contact conductive hole 3b are disposed on above source electrode and first drain electrode of the transistor unit 0, respectively. The ground line 4a is disposed on the first contact conductive hole 3a, and a first transition metal layer 4b is disposed on the second contact conductive hole 3b. The first transition metal layer 4b is connected with the lower end of the memory cell 65 of magnetic multilayer film. The above word line 62 is also the grid electrode of the transistor 0. The bit line 4c is disposed above and directly connected to the memory cell 65 of magnetic multilayer film, vertical with the word line 62, where 1a, 1b and 1c are insulation materials. An insulating passivation layer 1f is coated over said bit line 4c.

In this technical solution, the shape of the memory cell 65 of magnetic multilayer film is a hollow circular ring or elliptic ring, with certain width; the internal and external radius of said circular ring is 10-100000 nm and 20-200000 nm respectively. The internal minor axis of the elliptic ring is a=10-10000 nm, the ratio of the minor axis vs major axis a:b=1:1-1:5. The external minor axis of the elliptic ring is 20-200000 nm, and the width of the circular and elliptic ring is 20-200000 nm. The close-shaped magnetic multilayer film with a metal core includes non-pinning and pinning type, and other characteristics have been described above.

According to the Spin Torque (ST) effect and closed magnetic field effect generated by the current that both have been presented in the back ground, present invention has provided a control method of the magnetic random access memory based on closed magnetic multilayer film, which realizes reading and writing of the MRAM via the magnitude and direction of the current flowing through the memory cell RML. The details are as following:

When the current in the memory cell RML of closed magnetic multilayer film is lower than a specific threshold value $I_{C1}$ (corresponding current density $J_{C1}$=10-$10^2$ A/cm$^2$, current=current density×area of cross section of closed magnetic multilayer film), the magnetic state of the bit layer (soft magnetic layer or free soft magnetic layer) will not change, thus the reading operation of MRAM is realized;

When the current in the memory cell RML of closed magnetic multilayer film is larger than the lower threshold value $I_{C1}$ and is lower than a higher threshold value $I_{C2}$ (corresponding current density $J_{C2}$=$10^2$-$10^6$ A/cm$^2$, current=current density×area of cross section of closed magnetic multilayer film), the magnetic state of the bit layer (soft magnetic layer) of the memory cell of closed magnetic multilayer film will be changed by the direction of the current. The magnetic state of the bit layer (soft magnetic layer) is oriented clockwise or counter-clockwise via positive and negative spin polarized tunneling current (i.e. via combined actions of the driving action and spin torque of the ring magnetic field induced by the spin polarized tunneling current), and the magnetic state of the bit layer (soft magnetic layer) and pinned magnetic layer (reference layer or hard magnetic layer) is oriented along the same as or adverse (i.e. the magnetization is parallel or anti-parallel) to the direction of clockwise or counterclockwise, so that the two states with low and high resistance is achieved (i.e. to acquire the two states of high output voltage and low output voltage), that is to say, the writing operation of MRAM can be realized by controlling the magnitude and direction of the control current.

If the writing current has exceeded the higher threshold current value $I_{C2}$ (i.e. larger than the threshold value), the magnetic state of pinned magnetic layer (or hard magnetic layer) will be reversed which is oriented clockwise or counterclockwise originally, and the bit layer (soft magnetic layer) and pinned magnetic layer (or hard magnetic layer) will both be reversed to have the same magnetization direction, so that the writing current must be smaller than the higher threshold current value $I_{C2}$. That is to say, the reading current must be smaller than the lower threshold current value $I_{C1}$, while the writing current must be larger than the lower threshold current $I_{C1}$ and be smaller than the higher threshold current $I_{C2}$.

2. The present invention provides another magnetic random access memory based on the closed magnetic multilayer film with a metal core, as shown in FIGS. 10A, 10B and 10C. It includes:

The array of reading and writing control unit of the memory is comprised of the unit 0 in the transistor TR (including source 0b, drain 0a and light doping region 0c of the transistor), where the array of reading and writing control unit is integrated in the semiconductor substrate.

Memory cell 65 and the arrays thereof is comprised of memory cell of closed magnetic multilayer film with a metal core, wherein the geometric structure of the memory cell is closed magnetic multilayer film with a metal core. This closed magnetic multilayer film with a metal core includes two kinds, non-pinning and pinning, and the characteristics of which have been described above.

The TR unit in the above transistor is connect with the metal layer 4b in the memory cell RML of closed multilayer film with a metal core, and with the word line 62, a first bit line 4e and a second bit line 4d, where said the word line WL is also the grid of said transistor 0. Above two bit line 4e and 4d are disposed above the memory unit RML of closed magnetic multilayer film with a metal core. The first bit line 4e is perpendicular to above word line WL, and is directly connected to the memory unit RML of closed magnetic multilayer film with a metal core. The second bit line 4d is directly connected to the metal core of the memory unit RML of closed magnetic multilayer film with a metal core, and is insulated with the first bit line 4e by an insulation layer. 1a, 1b, 1c, 1e, and 1f are insulation materials.

Present invention has provided an access method of the magnetic random access memory which is based on the closed magnetic multilayer film with a metal core. The writing operation of MRAM is realized by the current which is applied to the metal core in the memory cell RML, and the reading operation of MRAM is realized by the tunneling current which is applied to the closed magnetic multilayer film in the memory cell RML, the details are as following:

When the current applied in the magnetic multilayer film of memory cell RML of closed magnetic multilayer film with a metal core is smaller than a specific lower threshold value $I_{C1}$ (corresponding current density $J_{C1}=10$-$10^2$ A/cm$^2$, current=current density×area of cross section of closed magnetic multilayer film), its bit layer (soft magnetic layer) will not change, realizing the reading operation of MRAM;

When the current is applied in the metal core of the memory cell RML of closed magnetic multilayer film with a metal core, the magnetic states of closed magnetic multilayer film can be conveniently controlled because a magnetic field created by the current distributes ring-wise, and the detailed steps are:

When the current applied in the metal core of memory cell RML of closed magnetic multilayer film with a metal core is larger than the lower threshold value $I_{C1}$ and is smaller than a higher threshold value $I_{C2}$ (corresponding current density $J_{C2}=10^2$-$10^6$ A/cm$^2$, current=current density×area of cross section of metal core), the magnetic states of the bit layer (soft magnetic layer) of the memory cell RML of closed magnetic multilayer film is changed by the direction of the current. The magnetic states of its bit layer (soft magnetic layer) is oriented clockwise or counter-clockwise via the clockwise or counter-clockwise magnetic field created by positive or negative driving current, so that the magnetic states of the bit layer (soft magnetic layer) and the pinned magnetic layer (reference layer or hard magnetic layer) are parallel or antiparallel along clockwise or counter-clockwise direction of the current (i.e. the magnetizations are parallel or anti-parallel) respectively. Thus two states of low and high resistance can be achieved. That is to say, the writing operation of can be realized via control of the current direction.

If writing current exceeds higher threshold current value $I_{C2}$ (i.e. larger than the threshold current), the magnetic states of the pinned magnetic layer (or hard magnetic layer) which is originally oriented clockwise or counter-clockwise will be reversed For example, the bit layer (soft magnetic layer) and pinned magnetic layer (reference layer or hard magnetic layer) are both reversed, leading to parallel configuration of the magnetizations, so the writing current must be smaller than the higher threshold current value $I_{C2}$. For instance, the reading current should be smaller than the lower threshold current $I_{C1}$, and the writing current should be larger than the lower threshold current $I_{C1}$ while smaller than the higher threshold current $I_{C2}$.

3. Present invention has provided another magnetic random access memory which is based on closed magnetic multilayer film with a metal core and whose reading and writing process are controlled by a transistor respectively, as shown in FIGS. 11A, 11B and 11C, including:

Array of reading and writing control units of memory is comprised of above first and second transistor TR unit 0 (including the source 0b1 and 0b2, common drain Oat, light doping region 0c of the first and second transistor). The array of reading and writing control units is integrated in the semiconductor substrate. The first transistor switch controls reading operation, and the second transistor switch controls writing operation. The grid 67 of the first transistor is also used as the first word line 67 (shared), the grid 63 of the second transistor is also used as the second word line 63 (shared);

A first conductive contact hole 3a, a second conductive contact hole 3b, a third conductive contact hole 3b2 are disposed over the shared drain 0a1 of the transistors, the source 0b1 of the first transistor, the source 0b2 of the second transistor, which are connected to the above first transitional metal layer 4a and 4b; the transitional metal layer 4a on the first contact hole 3a has also formed the ground line 4a; the fourth conductive contact hole 3d is connected to the second transitional metal layer 4f; the second transitional metal layer 4f is utilized as bottom conductive electrode to connect to the lower end of memory cell 65 of said circular ring or elliptic ring magnetic multilayer film, the upper end of which is disposed with and connect to a bit line 4c; the upper end of the circular or elliptic metal core disposed at the center of the memory cell 65 of circular ring or elliptic ring magnetic multilayer film contacts with the bit line 4c, the lower end of which connects to the first transitional metal layer 4b; the fifth insulative passivation layer 1f covers the bit line 4c.

The memory cell 65 and the array thereof which is constituted by the memory cell RML of closed magnetic multilayer film with a metal core, wherein the geometric structure of the memory cell is closed magnetic multilayer film with a metal core. The closed magnetic multilayer film with a metal core includes two kinds, non-pinning and pinning, and the characteristics of which are described above.

The control method of the magnetic random access memory based on the above close-shaped magnetic multilayer film with metal core is provided by the present invention. The wring operation in the MRAM is realized by applying a current on the metal core in the memory unit RML, and the reading operation is achieved by applying a tunneling current on the close-shaped magnetic multilayer film in the memory unit RML. The details are:

When the current applied in the magnetic multilayer film of memory cell RML of closed magnetic multilayer film with a metal core is smaller than a specific lower threshold value $I_{C1}$ (corresponding current density $J_{C1}=10$-$10^2$ A/cm$^2$, current=current density×area of cross section of closed magnetic multilayer film), its bit layer (soft magnetic layer) will not change, realizing the reading operation of MRAM;

When the current is applied in the metal core of the memory cell RML of closed magnetic multilayer film with a metal core, the magnetic states of closed magnetic multilayer film can be conveniently controlled because a magnetic field created by the current distributes ring-wise, and the detailed steps are:

When the current applied in the metal core of memory cell RML of closed magnetic multilayer film with a metal core is larger than the lower threshold value $I_{C1}$ and is smaller than a higher threshold value $I_{C2}$ (corresponding current density $J_{C2}=10^2$-$10^6$ A/cm$^2$, current=current density×area of cross section of metal core), the magnetic states of the bit layer (soft magnetic layer) of the memory cell RML of closed magnetic multilayer film is changed by the direction of the current. The magnetic states of its bit layer (soft magnetic layer) is oriented clockwise or counter-clockwise via the clockwise or counter-clockwise magnetic field created by positive or negative driving current, so that the magnetic states of the bit layer (soft magnetic layer) and the pinned magnetic layer (reference layer or hard magnetic layer) are parallel or antiparallel along clockwise or counter-clockwise direction of the current (i.e. the magnetizations are parallel or anti-parallel) respectively. Thus two states of low and high resistance can be achieved. That is to say, the writing operation of MRAM can be realized via control of the current direction.

If writing current exceeds higher threshold current value $I_{C2}$ (i.e. larger than the threshold current), the magnetic states of the pinned magnetic layer (or hard magnetic layer) which is originally oriented clockwise or counter-clockwise will be reversed For example, the bit layer (soft magnetic layer) and pinned magnetic layer (reference layer or hard magnetic layer) are both reversed, leading to parallel configuration of the magnetizations, so the writing current must be smaller than the higher threshold current value $I_{C2}$. For instance, the reading current should be smaller than the lower threshold current $I_{C1}$, and the writing current should be larger than the lower threshold current $I_{C1}$ while smaller than the higher threshold current $I_{C2}$.

The closed magnetic multilayer film with a metal core as provided by present invention utilizes closed ring structure prepared via micro-fabrication to replace the conventional magnetic multilayer film. When the conventional non-closed ring structure is used in prior art, it is hard to change the magnetic state of magnetic multilayer film due to the effect of demagnetization and shape anisotropy caused by conventional structures. Therefore, it depends on large magnitude magnetic field applied externally or from the combined magnetic field produced by large pulse current to control its magnetic state, resulting in high power consumption and high cost, and many disadvantages, such as noise, magnetic coupling and interference among adjacent cells and heating effect and cooling problem for the fabrication, integration and usage of the device, and some negative effects to the performance of the device. Present invention, however, can overcome the defects mentioned above by changing the geometric structure of magnetic multilayer film to improve the performance of the magnetic multilayer film, which, under the condition of keeping the original characteristics and performance of the magnetic multilayer film, has the advantage such as no demagnetization, least magnetic anisotropy, easy to change the magnetic state and direct controlled by current. Therefore, the structural and technical complexity brought by controlling the magnetic state via external magnetic field or the combined magnetic field created by large pulse current can be avoided, and the requirements for the large magnitude production is satisfied. That is to say, the closed magnetic multilayer film with a metal core according to present invention is more applicable for the fabrication of magnetic random access memory and new type of magnetic multilayer film sensors.

In prior art, the data writing operation of MRAM depends on the combined effect of the magnetic field created by word line and bit line to control the magnetic state of the bit layer in a memory cell. Therefore, two metal line disposing layers are required technically and structurally to dispose the word line and bit line respectively. Comparing with prior art, for the magnetic random access memory provided by present invention which is based on closed magnetic multilayer film realizes the reading and writing operation of the data by adopting new geometric structure of annular magnetic multilayer film as memory unit, utilizing the annular magnetic field created by the positive and negative polarized tunneling current themselves or the positive and negative driving current in the metal core, and combined with spin torque effect, which makes the control of MRAM become much more convenient. The data reading and writing operation are completed by a bit line which utilizes spin torque effect; the magnetic state in the bit layer of the closed magnetic multilayer film is driven by the annular magnetic field created by the current in the metal core, where the space distribution of driving magnetic field is well matched with the geometric shape of the memory cell, so the driving of the device becomes much easier. All these characteristics provide a good chance for the magnetic random access memory of present invention based on the closed magnetic multilayer film to avoid the negative effect caused by the uneven distribution of magnetic field space, and to improve the stability of the device working performance and the life of the device. At the same time, because the word line dedicated for writing operation in prior art has been eliminated in the magnetic random access memory that based on closed magnetic multilayer film according to present invention, the complexity of conventional MRAM structure, the difficulty of fabrication technique and the cost are greatly lowered. Therefore, the existing defects in prior art have been overcome to improve the application value of MRAM.

BRIEF DESCRIPTION OF THE DRAWINGS

FIG. 1 is a schematic diagram of the structure of the closed elliptic ring magnetic multilayer film which is non-pinning and has a single potential barrier; where FIG. 1-1 is the top view, and FIG. 1-2 is the cross section view;

FIG. 2 is a schematic diagram of the structure of the closed elliptic ring magnetic multilayer film which is pinning and has a single potential barrier; where FIG. 2-1 is the top view and FIG. 2-2 is the cross section view;

FIG. 3 is a schematic diagram of the structure of the closed elliptic ring magnetic multilayer film which is non-pinning and has a metal core and a single potential barrier; where FIG. 3-1 is the top view and FIG. 3-2 is the cross section view;

FIG. 4 is a schematic diagram of the structure of the closed elliptic ring magnetic multilayer film which is pinning and has a metal core and a single potential barrier; where FIG. 4-1 is the top view and FIG. 4-2 is the cross section view;

FIG. 5 is a schematic diagram of the structure of the closed elliptic ring magnetic junction multilayer film which is non-pinning and has double intermediate layers; where FIG. 5-1 is the top view and FIG. 5-2 is the cross section view;

FIG. 6 is a schematic diagram of the structure of the closed elliptic ring magnetic junction multilayer film which is pinning and has double intermediate layers; where FIG. 6-1 is the top view and FIG. 6-2 is the cross section view;

FIG. 7 is a schematic diagram of the structure of the closed elliptic ring magnetic junction multilayer film which is non-pinning and has double intermediate layers and a metal core; where FIG. 7-1 is the top view and FIG. 7-2 is the cross section view;

FIG. 8 is a schematic diagram of the structure of the closed elliptic ring magnetic junction multilayer film which is pinning and has double intermediate layers and a metal core; where FIG. 8-1 is the top view and FIG. 8-2 is the cross section view;

Figure 10A:
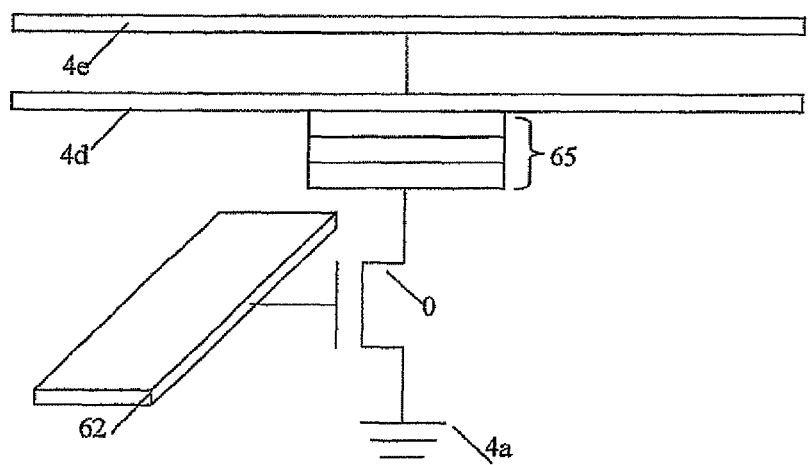
Figure 10B:
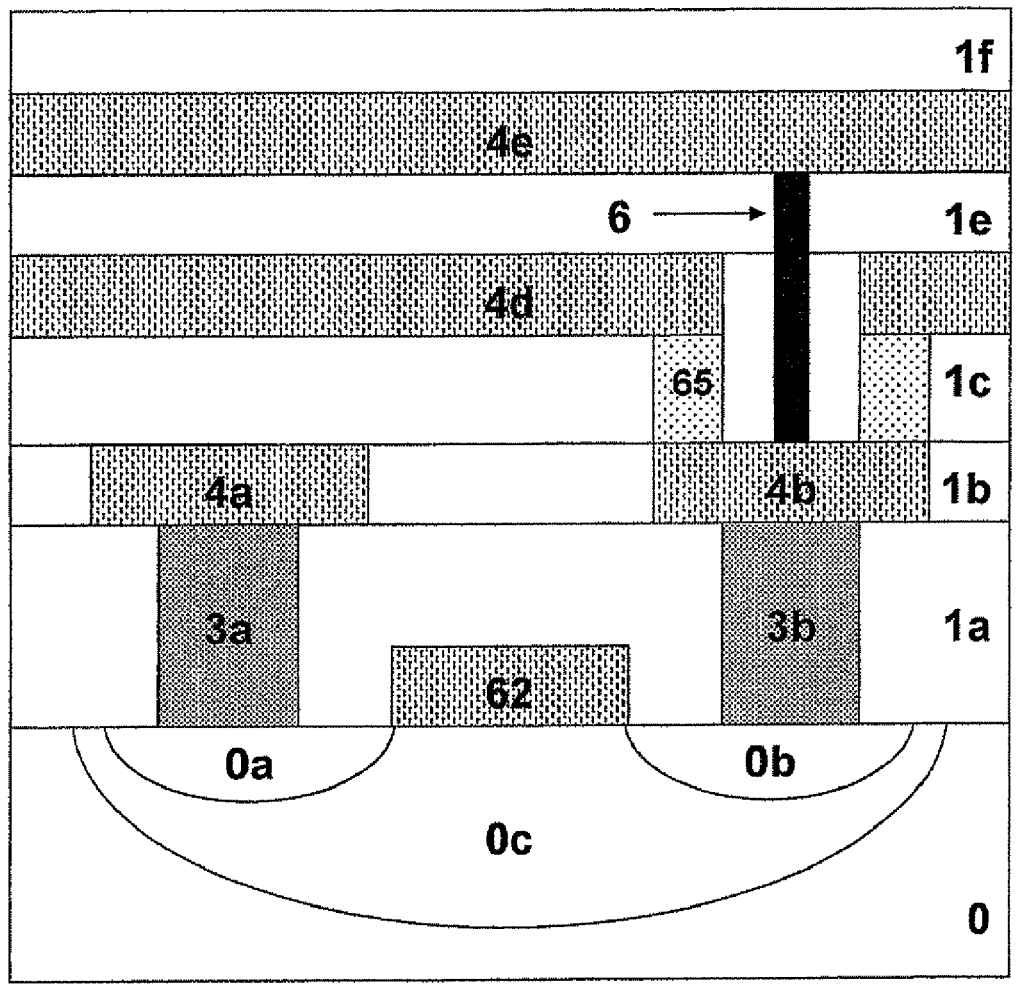
Figure 10C:
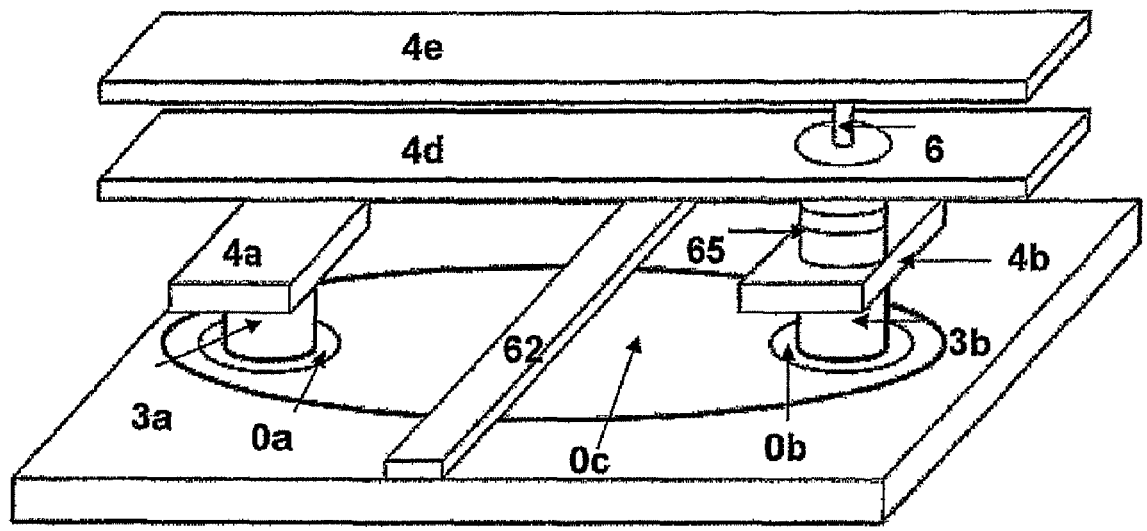

Where in FIG. 1-FIG. 8: 1—buffering conductive layer; 2—hard magnetic layer; 3—intermediate layer; 4—soft magnetic layer; 5—Capping layer; 6—metal core; 8—antiferromagnetic layer; 9—pinned magnetic layer; 21—first hard magnetic layer; 22—second hard magnetic layer; 31—first intermediate layer; 32—second intermediate layer; 81—first anti-ferromagnetic layer; 82—second anti-ferromagnetic layer; 91—first pinned magnetic layer; 92—second pinned magnetic layer; 31—first intermediate layer; 32—second intermediate layer;

FIG. 9 (A, B, C) is a schematic diagram of the structure of MRAM cell in embodiment 65 in a magnetic random access memory which is based on closed (including circular ring and elliptic ring) magnetic multilayer film;

FIG. 10 (A, B, C) is a schematic diagram of the structure of MRAM cell in embodiment 66 in a magnetic random access memory which is based on closed (including circular ring and elliptic ring) magnetic multilayer film, utilizes a transistor to control the reading and writing process of a memory, and is driven by the magnetic field generated by the current in the metal core;

FIG. 11 (A, B, C) shows a schematic diagram of the structure of MRAM cell in embodiment 66 in a magnetic random access memory which is based on closed (including circular ring and elliptic ring) magnetic multilayer film, utilizes two transistors to control the reading and writing process of a memory respectively, and is driven by the magnetic field generated by the current in the metal core;

Where in FIG. 9-FIG. 11, 0 is transistor TR, 0a is the drain of transistor TR, 0b is the source of transistor TR, 0b1 and 0b2 are the sources of first transistor and second transistor respectively, 0c is the light doping region of transistor, 62 is the grid of transistor 0 (word line WL), 63 and 67 are the grids of second transistor and first transistor (first word line WL1 and second word line WL2) respectively, 1a, 1b, 1c, 1d, 1e are the insulation layers in MRAM cells, 1f is insulative passivation layer, 3a is first conductive contact hole, 3b is second conductive contact hole, 3b2 is third conductive contact hole, 4a is ground line GND, 4b is first transitional metal layer, 4e is first bit line, 4d is second bit line, 65 is memory cell RML based on closed magnetic multilayer film.

DETAILED DESCRIPTION OF THE INVENTION

Embodiment 1

Preparing Non-Pinning Ring Magnetic Multilayer Film by Micro-Fabrication

A high vacuum magnetron sputtering device is utilized to deposit, in a sequence of, a bottom buffering conductive layer 1 Au of 2 nm thick, a hard magnetic layer (HFM) 2 Co of 3 nm thick, an intermediate layer (I) 3 Cu of 1 nm, a soft magnetic layer (SFM) 4 Co of 1 nm and a covering layer 5 Ru of 4 nm on a SiO2/Si substrate of 1 mm thick which has been cleansed by conventional method. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe in-plane magnetic field is applied when depositing hard magnetic layer 2 and soft magnetic layer 4.

The micro-fabrication techniques in prior art are applied to the deposited magnetic multilayer film, i.e. after resist coating and pre-baking, the substrate is exposed on an electron beam lithography machine according to the required pattern of ring. Then the next procedures are developing, fixing and post-baking, after which the magnetic multilayer film is etched into a ring via ion etching method. At last, the geometric structure of ring is formed after the resist is eliminated by dipping into stripping chemicals. The interior diameter of the ring is 500 nm, the exterior of the ring is 800 nm, and the width of the ring is 300 nm. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed ring magnetic multilayer film to bury each ring multilayer film while keeping them separated. Next, the micro-fabrication techniques in prior art are adopted for etching, i.e. first, the focusing ion beam device is positioned to the place where the ring multilayer film is deposited, then the $SiO_2$ insulation layer is etched via focusing ion beam etching method to expose the ring magnetic multilayer film buried under the insulation layer. Lastly, a conductive layer Au of 100 nm thick is deposited in a high vacuum magnetron sputtering system, the growing conditions of which are same as those described above. And the electrode is made by conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last the non-pinning ring magnetic multilayer film is obtained after the resist is stripped off by dipping into stripping chemicals.

Embodiments 2-7

Method of micro-fabrication is utilized which prepares non-pinning ring shaped magnetic multilayer film according to the same method as embodiment 1, the materials and thickness of each layer of the resulted magnetic multilayer film is listed in table 1.

TABLE 1 the structure of non-pinning ring shaped magnetic multilayer film according to the method of micro-fabrication of present invention

| | | embodiment | | | | | |
|---|---|---|---|---|---|---|---|
| | | 2 | 3 | 4 | 5 | 6 | 7 |
| substrate | component | Si/SiO2 | Si/SiO2 | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Ta | Cr | Ru | Pt |
| | thickness | 5 nm | 10 nm | 50 nm | 100 nm | 150 nm | 300 nm |
| Hard magnetic layer 2 | component | Co | Co | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cu | MgO | Al2O3 | AlN | ZnO |
| | thickness | 1 nm | 1 nm | 1 nm | 1 nm | 1 nm | 1 nm |
| Soft magnetic layer 4 | component | CoFeB | NiFeSiB | NiFe | NiFe | CoFeB | NiFeSiB |
| | thickness | 4 nm | 3 nm | 3 nm | 4 nm | 3 nm | 6 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| | thickness | 100 nm | 100 nm | 100 nm | 100 nm | 100 nm | 100 nm |
| Ring shaped structure | Interior diameter | 10 nm | 200 nm | 1000 nm | 1600 nm | 2000 nm | 100000 nm |
| | Exterior diameter | 20 nm | 400 nm | 2000 nm | 3200 nm | 4000 nm | 200000 nm |

Embodiment 8

Preparing Non-Pinning Elliptic Ring Magnetic Multilayer Film by Micro-Fabrication A high vacuum magnetron sputtering device is utilized to deposit, in a sequence of, a bottom buffering conductive layer 1 Au of 2 nm thick, a hard magnetic layer (HFM) 2 Co of 3 nm thick, an intermediate layer (I) 3 Cu of 1 nm, a soft magnetic layer (SFM) 4 Co of 1 nm and a covering layer 5 Ru of 4 nm on a $SiO_2$/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing hard magnetic layer 2 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 600 nm, the exterior diameter of the minor axis is 800 nm, the interior diameter of the major axis is 600 nm, the exterior diameter of the major axis is 900 nm, and the ratio of the interior diameter of the minor axis vs. that of major axis of the elliptic ring is 1:1.2. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed closed magnetic multilayer film to bury each closed multilayer film while keeping them separated. Next, the micro-fabrication techniques in prior art are adopted for etching, i.e. first, the focusing ion beam device is positioned to the place where the closed-ring multilayer film is deposited, then the $SiO_2$ insulation layer is etched via focusing ion beam etching method to expose the closed magnetic multilayer film buried under the insulation layer. Lastly, a conductive layer Au of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed magnetic multilayer film is obtained after the resist is stripped off by dipping into stripping chemicals. The schematic diagram of its structure is shown in FIG. 1.

Embodiment 9

Preparing Non-Pinning Elliptic Ring Magnetic Multilayer Film by Micro-Fabrication A high vacuum magnetron sputtering device is utilized to deposit, in a sequence of, a bottom buffering conductive layer 1 Au of 2 nm thick, a hard magnetic layer (HFM) 2 Co of 3 mm thick, an intermediate layer (I) 3 Cu of 1 nm, a soft magnetic layer (SFM) 4 Co of 1 nm and a covering layer 5 Ru of 4 nm on a SiO2/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing hard magnetic layer 2 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:1.5. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed closed magnetic multilayer film to bury each closed multilayer film while keeping them separated. Next, the micro-fabrication techniques in prior art are adopted for etching, i.e. first, the focusing ion beam device is positioned to the place where the close-ringed multilayer film is deposited, then the $SiO_2$ insulation layer is etched via focusing ion beam etching method to expose the closed magnetic multilayer film buried under the insulation layer. Lastly, a conductive layer Au of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed magnetic multilayer film is obtained after the resist is stripped off by dipping into stripping chemicals.

Embodiment 10-15

Micro-fabrication used in Embodiment 8 and 9 is utilized to make non-pinning closed elliptic magnetic multilayer film, and the materials and thickness of each layer of the resulted magnetic multilayer film are listed in table 2.

TABLE 2 the structure of non-pinning closed elliptic magnetic multilayer film according to the method of micro-fabrication of present invention

| | | embodiment | | | | | |
|---|---|---|---|---|---|---|---|
| | | 10 | 11 | 12 | 13 | 14 | 15 |
| substrate | component | Si/SiO$_2$ | Si/SiO$_2$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Ta | Cr | Ru | Pt |
| | thickness | 5 nm | 10 nm | 50 nm | 100 nm | 150 nm | 300 nm |
| Hard magnetic layer 2 | component | Co | Co | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cu | MgO | Al$_2$O$_3$ | AlN | ZnO |
| | thickness | 1 nm | 1 nm | 1 nm | 1 nm | 1 nm | 1 nm |
| Soft magnetic layer 4 | component | CoFeB | NiFeSiB | NiFe | NiFe | CoFeB | NiFeSiB |
| | thickness | 4 nm | 3 nm | 3 nm | 4 nm | 3 nm | 6 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| Closed elliptic Ring shaped structure | Interior diameter of minor axis | 10 nm | 200 nm | 1000 nm | 1600 nm | 2000 nm | 100000 nm |
| | Exterior diameter of minor axis | 20 nm | 400 nm | 2000 nm | 3200 nm | 4000 nm | 200000 nm |
| | Interior diameter of major axis | 20 nm | 400 nm | 3000 nm | 4800 nm | 8000 nm | 400000 nm |
| | Exterior diameter of major axis | 30 nm | 600 nm | 4000 nm | 6400 nm | 10000 nm | 500000 nm |

Embodiment 16

Preparing Pinning Ring Magnetic Multilayer Film by Micro-Fabrication

A high vacuum magnetron sputtering device is utilized to deposit, in a sequence of, a bottom buffering conductive layer 1 Au of 2 nm thick, an anti-ferromagnetic pinning layer (AFM) 8 IrMn of 10 nm thick, a pinned magnetic layer (FM) 9 Co$_{90}$Fe$_{10}$ of 3 nM thick on a Si/Si O$_2$ substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 CO$_{90}$Fe$_{10}$ of 3 nm thick and a covering layer 5 Au of 2 nm thick are deposited on the intermediate layer in sequence. The growing condition of above magnetic multilayer film: background vacuum: 5×10$^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing pinned magnetic layer 9 and soft magnetic layer 4. The micro-fabrication techniques in prior art are applied to the deposited magnetic multilayer film, i.e. after resist coating and pre-baking, the substrate is exposed on an electron beam lithography machine according to the required pattern of ring. Then the next procedures are developing, fixing and post-baking, after which the magnetic multilayer film is etched into a ring via ion etching method. At last, the geometric structure of ring is formed after the resist is eliminated by dipping into stripping chemicals. The interior diameter of the ring is 300 nm, the exterior of the ring is 600 nm, and the width of the ring is 300 nm. Then the conventional film growing methods such as magnetron sputtering, electron beam evaporation, pulse laser deposition, electrochemical deposition, molecular beam epitaxy, etc. are adopted to deposit a SiO$_2$ insulation layer of 50 nm thick on the etching-formed ring magnetic multilayer film to bury each ring multilayer film while keeping them separated. Next, the micro-fabrication techniques in prior art are adopted for etching, i.e. first, the focusing ion beam device is positioned to the place where the ring multilayer film is deposited, then the SiO$_2$ insulation layer is etched via focusing ion beam etching method to expose the ring magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning ring magnetic multilayer film is obtained after the resist is stripped off by dipping into stripping chemicals.

Embodiment 17-22

Micro-fabrication used in Embodiment 3 is utilized to make pinning ring-shaped magnetic multilayer film, and the materials and thickness of each layer of the resulted magnetic multilayer film are listed in table 3.

TABLE 3 the structure of pinning ring shaped magnetic multilayer film according to the method of micro-fabrication of present invention

| | | embodiment | | | | | |
|---|---|---|---|---|---|---|---|
| | | 17 | 18 | 19 | 20 | 21 | 22 |
| substrate | component | $SiO_2/Si$ | $SiO_2/Si$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Ta | Cr | Ru | Pt |
| | thickness | 5 nm | 10 nm | 50 nm | 100 nm | 150 nm | 300 nm |
| Anti-ferromagnetic pinning layer 8 | component | IrMn | FeMn | IrMn | CrMn | IrMn | PtMn |
| | thickness | 10 nm | 10 nm | 10 nm | 10 nm | 10 nm | 10 nm |
| Pinned magnetic layer 9 | Component | Co | Fe | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cr | MgO | $Al_2O_3$ | AlN | ZnO |
| | thickness | 1 nm | 1 nm | 1 nm | 1 nm | 1 nm | 1 nm |
| Soft magnetic layer 4 | component | Co | Fe | CoFeB | NiFeCo | CoFe | CoFeSiB |
| | thickness | 4 nm | 5 nm | 5 nm | 5 nm | 5 nm | 4 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| | thickness | 100 nm | 100 nm | 100 nm | 100 nm | 100 nm | 100 nm |
| Ring shaped structure | Interior diameter | 10 nm | 200 nm | 1000 nm | 1600 nm | 2000 nm | 100000 nm |
| | Exterior diameter | 20 nm | 400 nm | 2000 nm | 3200 nm | 4000 nm | 200000 nm |

Embodiment 23

Preparing Pinning Closed Elliptic Magnetic Multilayer Film by Micro-Fabrication

A high vacuum magnetron sputtering device is utilized to deposit, in a sequence of, a bottom buffering conductive layer 1 Au of 2 nm thick, an anti-ferromagnetic pinning layer (AFM) 8 IrMn of 10 nm thick, a pinned magnetic layer (FM) 9 $CO_{90}Fe_{10}$ of 3 nm thick on a Si/Si $O_2$ substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 $CO_{90}Fe_{10}$ of 3 nm thick and a covering layer 5 Au of 2 nm thick are deposited on the intermediate layer in sequence. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing pinned magnetic layer and soft magnetic layer. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 600 nm, the exterior diameter of the major axis is 900 nm, and the ratio of the interior diameter of the minor axis vs. that of major axis of the elliptic ring is 1:1.2. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning closed magnetic multilayer film is obtained after the resist is stripped off by dipping into stripping chemicals. The schematic diagram of its structure is shown in FIG. 2.

Embodiment 24

Preparing Pinning Closed Elliptic Ring Magnetic Multilayer Film by Micro-Fabrication A high vacuum magnetron sputtering device is utilized to deposit, in a sequence of, a bottom buffering conductive layer 1 Au of 2 nm thick, an anti-ferromagnetic pinning layer (AFM) 8 IrMn of 10 nm thick, a pinned magnetic layer (FM) 9 $CO_{90}Fe_{10}$ of 3 nm thick on a Si/Si $O_2$ substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 $CO_{90}Fe_{10}$ of 3 nm thick and a covering layer 5 Au of 2 nm thick are deposited on the intermediate layer in sequence. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing pinned magnetic layer and soft magnetic layer. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning closed magnetic multilayer film is obtained after the resist is stripped off by dipping into stripping chemicals.

Embodiment 25-30

Micro-fabrication used in Embodiment 23 and 24 is utilized to make the pinning closed elliptic-shaped magnetic multilayer film, the materials and thickness of each layer of the resulted magnetic multilayer film are listed in table 4.

TABLE 4 the structure of pinning closed elliptic ring shaped magnetic multilayer film according to the method of micro-fabrication of present invention

| | | embodiment | | | | | |
|---|---|---|---|---|---|---|---|
| | | 25 | 26 | 27 | 28 | 29 | 30 |
| substrate | component | Si/SiO$_2$ | Si/SiO$_2$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Ta | Cr | Ru | Pt |
| | thickness | 5 nm | 10 nm | 50 nm | 100 nm | 150 nm | 300 nm |
| Anti-ferromagnetic pinning layer 8 | component | IrMn | FeMn | IrMn | IrMn | IrMn | PtMn |
| | thickness | 10 nm | 10 nm | 10 nm | 10 nm | 10 nm | 10 nm |
| Pinned magnetic layer 9 | component | Co | Fe | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cr | MgO | Al$_2$O$_3$ | AlN | ZnO |
| | thickness | 1 nm | 1 nm | 1 nm | 1 nm | 1 nm | 1 nm |
| Soft magnetic layer 4 | component | Co | Fe | CoFeB | NiFeCo | CoFe | NiFeSiB |
| | thickness | 4 nm | 5 nm | 5 nm | 5 nm | 5 nm | 4 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| | thickness | 100 nm | 100 nm | 100 nm | 100 nm | 100 nm | 100 nm |
| Closed elliptic Ring shaped structure | Interior diameter of minor axis | 10 nm | 200 nm | 1000 nm | 1600 nm | 2000 nm | 100000 nm |
| | Exterior diameter of minor axis | 20 nm | 400 nm | 2000 nm | 3200 nm | 4000 nm | 200000 nm |
| | Interior diameter of major axis | 20 nm | 400 nm | 3000 nm | 4800 nm | 8000 nm | 400000 nm |
| | Exterior diameter of major axis | 30 nm | 600 nm | 4000 nm | 6400 nm | 10000 nm | 500000 nm |

Embodiment 31

Preparing Non-Pinning Ring Magnetic Multilayer Film with a Metal Core by Micro-Fabrication A high vacuum magnetron sputtering device is utilized to deposit, in a sequence of, a bottom buffering conductive layer 1 Ru of 5 nm thick, a hard magnetic layer (HFM) 2 Co of 3 nm thick, an intermediate layer (I) 3 Cu of 1 nm, a soft magnetic layer (SFM) 4 Co of 1 nm and a covering layer 5 Ru of 4 nm on a SiO2/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe inducing magnetic field is applied when depositing hard magnetic layer 2 and soft magnetic layer 4. The micro-fabrication techniques in prior art are applied to the deposited magnetic multilayer film, i.e. after resist coating and pre-baking, the substrate is exposed on an electron beam lithography machine according to the required pattern of ring. Then the next procedures are developing, fixing and post-baking, after which the magnetic multilayer film is etched into a ring via ion etching method. At last, the geometric structure of ring is formed after the resist is eliminated by dipping into stripping chemicals. The interior diameter of the ring is 500 nm, the exterior of the ring is 800 nm, and the width of the ring is 300 nm. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed ring magnetic multilayer film to bury each ring multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the $SiO_2$ insulation layer to form a cylindrical hole, whose diameter is 300 nm, and then focusing ion beam assisted deposition method is used to deposit metal material Au in the hole to form a Au metal core 6, the diameter of which is 300 nm. Next, the micro-fabrication techniques in prior art are adopted for etching, i.e. first, the focusing ion beam device is positioned to the place where the ring multilayer film is deposited, then the $SiO_2$ insulation layer is etched via focusing ion beam etching method to expose the ring magnetic multilayer film buried under the insulation layer. Lastly, a conductive layer Au of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning ring magnetic multilayer film with a metal core is obtained after the resist is stripped off by dipping into stripping chemicals.

Embodiment 32-37

Micro-fabrication used in Embodiment 31 is utilized to make the non-pinning ring-shaped magnetic multilayer film, and the materials and thickness of each layer of the resulted magnetic multilayer film are listed in table 5.

TABLE 5 the structure of non-pinning ring shaped magnetic multilayer film with a metal core according to the method of micro-fabrication of present invention

| | | Embodiment | | | | | |
|---|---|---|---|---|---|---|---|
| | | 32 | 33 | 34 | 35 | 36 | 37 |
| substrate | component | Si/SiO₂ | Si/SiO₂ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Cr | Ta | Ru | Pt |
| | thickness | 5 nm | 10 nm | 50 nm | 100 nm | 150 nm | 300 nm |
| Hard magnetic layer 2 | component | Co | Co | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cu | MgO | Al₂O₃ | AlN | ZnO |
| | thickness | 1 nm | 1 nm | 1 nm | 1 nm | 1 nm | 1 nm |
| Soft magnetic layer 4 | component | CoFeB | NiFeSiB | NiFe | NiFe | CoFeB | NiFeSiB |
| | thickness | 4 nm | 3 nm | 3 nm | 4 nm | 3 nm | 6 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| | thickness | 100 nm | 100 nm | 100 nm | 100 nm | 100 nm | 100 nm |
| Metal core 6 | Component | Au | Ag | Pt | Ta | W | Ti |
| | diameter | 5 nm | 100 nm | 500 nm | 800 nm | 1000 nm | 50000 nm |
| Ring shaped structure | Interior diameter | 10 nm | 200 nm | 1000 nm | 1600 nm | 2000 nm | 100000 nm |
| | Exterior diameter | 20 nm | 400 nm | 2000 nm | 3200 nm | 4000 nm | 200000 nm |

Embodiment 38

Preparing Non-Pinning Elliptic Ring Magnetic Multilayer Film with a Metal Core by Micro-Fabrication A high vacuum magnetron sputtering device is utilized to deposit, in a sequence of, a bottom buffering conductive layer 1 Au of 2 nm thick, a hard magnetic layer (HFM) 2 Co of 3 nm thick, an intermediate layer (I) 3 Cu of 1 nm, a soft magnetic layer (SFM) 4 Co of 1 nm and a covering layer 5 Ru of 4 nm on a SiO2/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing hard magnetic layer 2 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 600 nm, the exterior diameter of the major axis is 900 nm, and the ratio of the interior diameter of the minor axis vs. that of major axis of the elliptic ring is 1:1.2. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed closed magnetic multilayer film to bury each closed multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the $SiO_2$ insulation layer to form a cylindrical hole, whose cross section is elliptic, wherein the diameter of minor axis of the ellipse is 300 nm, the ration of minor axis vs. major axis is 1:1.2, and then focusing ion beam assisted deposition method is used to deposit metal material Au in the hole to form a Au metal core 6, the vertical section of which is a rectangular, and the shape of cross section is as described above. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Au of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed magnetic multilayer film is obtained after the resist is stripped off by dipping into stripping chemicals. The schematic diagram of its structure is shown in FIG. 3.

Embodiment 39

Preparing Non-Pinning Elliptic Magnetic Multilayer Film with a Metal Core by Micro-Fabrication A high vacuum magnetron sputtering device is utilized to deposit, in a sequence of, a bottom buffering conductive layer 1 Au of 2 nm thick, a hard magnetic layer (HFM) 2 Co of 3 nm thick, an intermediate layer (I) 3 Cu of 1 nm, a soft magnetic layer (SFM) 4 Co of 1 nm and a covering layer 5 Ru of 4 nm on a SiO2/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing hard magnetic layer 2 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 µm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 100 nm thick on the etching-formed closed magnetic multilayer film to bury each closed multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the $SiO_2$ insulation layer to form a cylindrical hole, whose cross section is elliptic, wherein the diameter of minor axis of the ellipse is 300 nm, the ration of minor axis vs. major axis is 1:5, and then focusing ion beam assisted deposition method is used to deposit metal material Au in the hole to form a Au metal core 6, the vertical section of which is a rectangular, and the shape of cross section is as described above. Next, the micro-fabrication techniques in prior art are adopted for etching, i.e. first, the focusing ion beam device is positioned to the place where the closed elliptic multilayer film is deposited, then the $SiO_2$ insulation layer is etched via focusing ion beam etching method to expose the closed magnetic multilayer film buried under the insulation layer. Lastly, a conductive layer Au of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed magnetic multilayer film is obtained after the resist is stripped off by dipping into stripping chemicals.

Embodiment 40-45

Micro-fabrication used in Embodiment 38 and 39 is utilized to make the non-pinning closed magnetic multilayer film with a metal core, and the materials and thickness of each layer of the resulted magnetic multilayer film are listed in table 6.

TABLE 6 the structure of non-pinning closed magnetic multilayer film with a metal core according to the method of micro-fabrication of present invention

| | | embodiment | | | | | |
|---|---|---|---|---|---|---|---|
| | | 40 | 41 | 42 | 43 | 44 | 45 |
| substrate | component | Si/SiO$_2$ | Si/SiO$_2$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Cr | Ta | Ru | Pt |
| | thickness | 5 nm | 10 nm | 50 nm | 100 nm | 150 nm | 300 nm |
| Hard magnetic layer 2 | component | Co | Co | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cu | MgO | Al$_2$O$_3$ | AlN | ZnO |
| | thickness | 1 nm | 1 nm | 1 nm | 1 nm | 1 nm | 1 nm |
| Soft magnetic layer 4 | component | CoFeB | NiFeSiB | NiFe | NiFe | CoFe | NiFeSiB |
| | thickness | 4 nm | 3 nm | 3 nm | 4 nm | 3 nm | 6 nm |
| Capping layer 5 | component | Cr | Ta | Ta | Cr | Ru | Pt |
| | thickness | 5 nm | 5 nm | 5 nm | 5 nm | 5 nm | 5 nm |
| Conductive layer | component | Al | Au | Cu | Al | Au | Cu |
| | thickness | 100 nm | 100 nm | 100 nm | 100 nm | 100 nm | 100 nm |
| Metal core 6 | Component | Au | Ag | Pt | Ta | W | Ti |
| | Minor axis | 10 nm | 50 nm | 250 nm | 1000 nm | 250 nm | 20000 nm |
| | Major axis | 10 nm | 100 nm | 750 nm | 3000 nm | 1000 nm | 80000 nm |
| Closed elliptic Ring shaped structure | Interior diameter of minor axis | 20 nm | 200 nm | 1000 nm | 1600 nm | 2000 nm | 100000 nm |
| | Exterior diameter of minor axis | 30 nm | 400 nm | 2000 nm | 3200 nm | 4000 nm | 200000 nm |
| | Interior diameter of major axis | 20 nm | 400 nm | 3000 nm | 4800 nm | 8000 nm | 400000 nm |
| | Exterior diameter of major axis | 30 nm | 600 nm | 4000 nm | 6400 nm | 10000 nm | 500000 nm |

Embodiment 46

Preparing Pinning Ring Magnetic Multilayer Film with a Metal Core by Micro-Fabrication A high vacuum magnetron sputtering device is utilized to deposit, in a sequence of, a bottom buffering conductive layer 1 Cr of 2 nm thick, an anti-ferromagnetic pinning layer (AFM) 8 IrMn of 10 nm thick, a pinned magnetic layer (FM) 9 CO$_{90}$Fe$_{10}$ of 3 nm thick on a SiO$_2$/Si substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 CO$_{90}$Fe$_{10}$ of 1 nm thick and a covering layer 5 Au of 2 nm thick are deposited on the intermediate layer in sequence. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe inducing magnetic field is applied when depositing pinned magnetic layer 9 and soft magnetic layer 4. The micro-fabrication techniques in prior art are applied to the deposited magnetic multilayer film, i.e. after resist coating and pre-baking, the substrate is exposed on an electron beam lithography machine according to the required pattern of ring. Then the next procedures are developing, fixing and post-baking, after which the magnetic multilayer film is etched into a ring via ion etching method. At last, the geometric structure of ring is formed after the resist is eliminated by dipping into stripping chemicals. The interior diameter of the ring is 300 nm the exterior of the ring is 600 nm, and the width of the ring is 300 nm. Then the conventional film growing methods such as magnetron sputtering, electron beam evaporation, pulse laser deposition, electrochemical deposition, molecular beam epitaxy, etc. are adopted to deposit a SiO$_2$ insulation layer of 50 nm thick on the etching-formed ring magnetic multilayer film to bury each ring multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the SiO$_2$ insulation layer to form a cylindrical hole, whose diameter is 300 nm, and then focusing ion beam assisted deposition method is used to deposit metal material Cu in the hole to form a Cu metal core 6, the diameter of which is 300 nm. Next, the micro-fabrication techniques in prior art are adopted for etching, i.e. first, the focusing ion beam device is positioned to the place where the ring multilayer film is deposited, then the SiO$_2$ insulation layer is etched via focusing ion beam etching method to expose the ring magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning ring magnetic multilayer film with a metal is obtained after the resist is stripped off by dipping into stripping chemicals.

Embodiment 47-52

Micro-fabrication used in Embodiment 46 is utilized to make the pinning ring-shaped magnetic multilayer film with a metal core, and the materials and thickness of each layer of the resulted magnetic multilayer film are listed in table 7.

TABLE 7 the structure of pinning ring shaped magnetic multilayer film with a metal core according to the method of micro-fabrication of present invention

| | | embodiment | | | | | |
|---|---|---|---|---|---|---|---|
| | | 47 | 48 | 49 | 50 | 51 | 52 |
| substrate | component | Si/SiO$_2$ | Si/SiO$_2$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Cr | Ta | Ru | Pt |
| | thickness | 5 nm | 10 nm | 50 nm | 100 nm | 150 nm | 300 nm |
| Anti-ferromagnetic pinning layer 8 | component | IrMn | FeMn | IrMn | CrMn | IrMn | PtMn |
| | thickness | 10 nm | 10 nm | 10 nm | 10 nm | 10 nm | 10 nm |
| Pinned magnetic layer 9 | Component | Co | Fe | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cr | MgO | Al$_2$O$_3$ | AlN | ZnO |
| | thickness | 1 nm | 1 nm | 1 nm | 1 nm | 1 nm | 1 nm |
| Soft magnetic layer 4 | component | Co | Fe | CoFeB | NiFeCo | CoFe | CoFeSiB |
| | thickness | 4 nm | 5 nm | 5 nm | 5 nm | 5 nm | 4 nm |
| Capping layer 5 | component | Cr | Ta | Ta | Cr | Ru | Pt |
| | thickness | 100 nm | 100 nm | 100 nm | 100 nm | 100 nm | 100 nm |
| Conductive layer | component | Al | Au | Cu | Al | Au | Cu |
| | thickness | 5 nm | 5 nm | 5 nm | 5 nm | 5 nm | 5 nm |
| Metal core 6 | Component | Au | Ag | Pt | Ta | W | Ti |
| | thickness | 5 nm | 100 nm | 500 nm | 800 nm | 1000 nm | 5000 nm |
| Ring shaped structure | Interior diameter | 10 nm | 200 nm | 1000 nm | 1600 nm | 2000 nm | 100000 nm |
| | Exterior diameter | 20 nm | 400 nm | 2000 nm | 3200 nm | 4000 nm | 200000 nm |

Embodiment 53

Preparing Pinning Closed Elliptic Ring Magnetic Multilayer Film with a Metal Core by Micro-Fabrication A high vacuum magnetron sputtering device is utilized to deposit, in a sequence of, a bottom buffering conductive layer 1 Au of 2 nm thick an anti-ferromagnetic pinning layer (AFM) 8 IrMn of 10 nm thick, a pinned magnetic layer (FM) 9 Co$_{90}$Fe$_{10}$ of 3 nm thick on a Si/Si O$_2$ substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 Co$_{90}$Fe$_{10}$ of 3 nm thick and a covering layer 5 Au of 2 nm thick are deposited on the intermediate layer in sequence. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing pinned magnetic layer 9 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 600 nm, the exterior diameter of the major axis is 900 nm, and the ratio of the interior diameter of the minor axis vs. that of major axis of the elliptic ring is 1:1.2. Then the conventional film growing methods such as magnetron sputtering, electron beam evaporation, pulse laser deposition, electrochemical deposition, molecular beam epitaxy, etc. are adopted to deposit a SiO$_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the SiO$_2$ insulation layer to form a cylindrical hole, whose cross section is elliptic, wherein the diameter of minor axis of the ellipse is 300 nm, the ration of minor axis vs. major axis is 1:1.2, and then focusing ion beam assisted deposition method is used to deposit metal material Au in the hole to form a Au metal core 6, the vertical section of which is a rectangular, and the shape of cross section is as described above. Next, the micro-fabrication techniques in prior art are adopted for etching, i.e. first, the focusing ion beam device is positioned to the place where the closed ring multilayer film is deposited, then the SiO$_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning closed magnetic multilayer film is obtained after the resist is stripped off by dipping into stripping chemicals. The schematic diagram of its structure is shown in FIG. 4.

Embodiment 54

Preparing Pinning Closed Elliptic Ring Magnetic Multilayer Film with a Metal Core by Micro-Fabrication A high vacuum magnetron sputtering device is utilized to deposit, in a sequence of, a bottom buffering conductive layer 1 Au of 2 nm thick, an anti-ferromagnetic pinning layer (AFM) 8 IrMn of 10 nm thick, a pinned magnetic layer (FM) 9 CO$_{90}$Fe$_{10}$ of 3 nm thick on a Si/Si O$_2$ substrate of 0.8 mm thick which has been cleansed by conventional method; then a Al layer of 1 nm thick is deposited, which, after 50 seconds plasma oxidation, forms a layer of insulation as the intermediate layer (I) 3; then a soft magnetic layer (FM) 4 CO$_{90}$Fe$_{10}$ of 3 nm thick and a covering layer 5 Au of 2 nm thick are deposited on the intermediate layer in sequence. The growing condition of above magnetic multilayer film: background vacuum: 5×10$^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing pinned magnetic layer 9 and soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a SiO$_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the SiO$_2$ insulation layer to form a cylindrical hole, whose cross section is elliptic, wherein the diameter of minor axis of the ellipse is 300 nm, the ration of minor axis vs. major axis is 1:5, and then focusing ion beam assisted deposition method is used to deposit metal material Au in the hole to form a Au metal core 6, the vertical section of which is a rectangular, and the shape of cross section is as described above. Next, the micro-fabrication techniques in prior art are adopted for etching, i.e. first, the focusing ion beam device is positioned to the place where the closed ring multilayer film is deposited, then the SiO$_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the pinning closed magnetic multilayer film is obtained after the resist is stripped off by dipping into stripping chemicals.

Embodiment 55-60

Micro-fabrication used in Embodiment 53 and 54 is utilized to make pinning closed elliptic-shaped magnetic multilayer film with a metal core, and the materials and thickness of each layer of the resulted magnetic multilayer film are listed in table 8.

TABLE 8 the structure of pinning closed elliptic ring shaped magnetic multilayer film with a metal core according to the method of micro-fabrication of present invention

| | | embodiment | | | | | |
|---|---|---|---|---|---|---|---|
| | | 55 | 56 | 57 | 58 | 59 | 60 |
| substrate | component | Si/SiO$_2$ | Si/SiO$_2$ | SiC | SiC | GaAs | GaAs |
| | thickness | 0.3 mm | 0.5 mm | 0.5 mm | 0.7 mm | 0.7 mm | 1 mm |
| Bottom buffering conductive layer 1 | component | Cr | Ta | Cr | Ta | Ru | Pt |
| | thickness | 5 nm | 10 nm | 50 nm | 100 nm | 150 nm | 300 nm |
| Anti-ferromagnetic pinning layer 8 | component | IrMn | FeMn | IrMn | CrMn | IrMn | PtMn |
| | thickness | 10 nm | 10 nm | 10 nm | 10 nm | 10 nm | 10 nm |

TABLE 8-continued the structure of pinning closed elliptic ring shaped magnetic multilayer film with a metal core according to the method of micro-fabrication of present invention

| | | embodiment | | | | | |
|---|---|---|---|---|---|---|---|
| | | 55 | 56 | 57 | 58 | 59 | 60 |
| Pinned magnetic layer 9 | component | Co | Fe | CoFeB | NiFeCo | CoFe | CoFeSiB |
| | thickness | 4 nm | 5 nm | 5 nm | 5 nm | 5 nm | 4 nm |
| Intermediate layer 3 | component | Cu | Cr | MgO | $Al_2O_3$ | AlN | ZnO |
| | thickness | 1 nm | 1 nm | 1 nm | 1 nm | 1 nm | 1 nm |
| Soft magnetic layer 4 | component | Co | Fe | CoFeB | NiFeCo | CoFe | NiFeSiB |
| | thickness | 4 nm | 5 nm | 5 nm | 5 nm | 5 nm | 4 nm |
| Capping layer 5 | component | Cr | Ta | Ta | Cr | Ru | Pt |
| | thickness | 100 nm | 100 nm | 100 nm | 100 nm | 100 nm | 100 nm |
| Conductive layer | component | Al | Au | Cu | Al | Au | Cu |
| | thickness | 5 nm | 5 nm | 5 nm | 5 nm | 5 nm | 5 nm |
| Metal core 6 | component | Au | Ag | Pt | Ta | W | Ti |
| | Minor axis | 10 nm | 50 nm | 250 nm | 1000 nm | 250 nm | 20000 nm |
| | Major axis | 10 nm | 100 nm | 750 nm | 3000 nm | 1000 nm | 80000 nm |
| Closed elliptic Ring shaped structure | Interior diameter of minor axis | 20 nm | 200 nm | 1000 nm | 1600 nm | 2000 nm | 100000 nm |
| | Exterior diameter of minor axis | 30 nm | 400 nm | 2000 nm | 3200 nm | 4000 nm | 200000 nm |
| | Interior diameter of major axis | 20 nm | 400 nm | 3000 nm | 4800 nm | 8000 nm | 400000 nm |
| | Exterior diameter of major axis | 30 nm | 600 nm | 4000 nm | 6400 nm | 10000 nm | 500000 nm |

Embodiment 61

Preparing Non-Pinning Elliptic Ring Magnetic Tunnel Junction with Double Intermediate Layers A high vacuum magnetron sputtering device is utilized to deposit, in a sequence of, a bottom buffering conductive layer 1 Ta of 2 nm thick, a first hard magnetic layer (HFM) 2 1 Co of 3 nm thick, a first intermediate layer (I) 3 1 $Al_2O_3$ of 1 nm thick, a soft magnetic layer (SEM) 4 NiFe of 1 nm thick, a second intermediate layer 3 2 $Al_2O_3$ of 1 nm thick, a second hard magnetic layer (HFM) 2 2 $Co_{90}Fe_{10}$ of 3 nm thick and a covering layer 5 Ru of 4 nm thick on a SiO2/Si substrate of 1 mm thick which has been cleansed by conventional method. The growing condition of above magnetic multilayer film: background vacuum: $5 \times 10^{-7}$ pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing the ferromagnetic layers. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed multilayer film while keeping them separated. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed elliptic ring magnetic tunnel junction with double intermediate layers is obtained after the resist is stripped off by dipping into stripping chemicals. The schematic diagram of its structure is shown in FIG. 5.

Embodiment 62

Preparing Pinning Closed Elliptic Ring Magnetic Tunnel Junction with Double Intermediate Layers A high vacuum magnetron sputtering device is utilized to deposit, in a sequence of, a bottom buffering conductive layer 1 Ta of 2 nm thick, a first anti-ferromagnetic pinning layer 81 IrMn of 10 nm thick, a first pinned magnetic layer 91 CoFeB of 5 nm thick, a first intermediate layer 31 Al2O3 of 1 nm thick, a soft magnetic layer 4 Co of 1 nm thick, a second intermediate layer 32 Al2O3 of 1 nm thick, a second pinned magnetic layer CoFeB of 5 nm thick, a second antiferromagnetic pinning layer IrMn of 10 nm thick and a capping layer Ru of 4 nm on a $SiO_2$/Si substrate of 1 mm thick which has been cleansed by conventional method. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing the first anti-ferromagnetic pinning layer 81, the second anti-ferromagnetic pinning layer 82, the first pinned magnetic layer 91, the second pinned magnetic layer 92 and the soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the closed elliptic ring shaped magnetic tunnel junction with double intermediate layers is obtained after the resist is stripped off by dipping into stripping chemicals. The schematic diagram of its structure is shown in FIG. 6.

Embodiment 63

Preparing Non-Pinning Elliptic Ring Magnetic Tunnel Junction with Double Intermediate Layers and a Metal Core A high vacuum magnetron sputtering device is utilized to deposit, in a sequence of, a bottom buffering conductive layer 1 Ta of 2 nm thick, a first hard magnetic layer (HFM) 2 1 Co of 3 nm thick, a first intermediate layer (I) 3 1 $Al_2O_3$ of 1 nm thick, a soft magnetic layer (SFM) 4 NiFe of 1 nm thick, a second intermediate layer 3 2 $Al_2O_3$ of 1 nm thick, a second hard magnetic layer (HFM) 2 2 $Co_{90}Fe_{10}$ of 3 nm thick and a covering layer 5 Ru of 4 nm thick on a SiO2/Si substrate of 1 mm thick which has been cleansed by conventional method. The growing condition of above magnetic multilayer film: background vacuum: $5 \times 10^{-7}$ Pa; the pressure of high purity argon for sputtering: 0.07 Pa; sputtering power: 120 W; spinning speed of sample-shelf: 20 rmp; growing temperature: room temperature; growing speed: 0.3-1.1 Å/s; growing period: film thickness/growing speed; a 150 Oe plane inducing magnetic field is applied when depositing the ferromagnetic layers. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed ring via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed multilayer film while keeping them separated. Next, the micro-fabrication techniques in prior art are adopted for etching, i.e. first, the focusing ion beam device is positioned to the geometric center of the ring multilayer film, ten the method of focusing ion beam etching is used to etch the $SiO_2$ insulation layer to form a cylindrical hole, whose cross section is elliptic, wherein the diameter of minor axis of the ellipse is 300 nm, the ration of minor axis vs. major axis is 1:5, and then focusing ion beam assisted deposition method is used to deposit metal material Au in the hole to form a Au metal core 6, the cross section of which is an ellipse, and the shape of cross section is as described above. Next the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the non-pinning closed elliptic ring magnetic tunnel junction with double intermediate layers and a metal core is obtained after the resist is stripped off by dipping into stripping chemicals. The schematic diagram of its structure is shown in FIG. 7.

Embodiments 64

Preparing Pinning Closed Elliptic Ring Magnetic Tunnel Junction with Double Intermediate Layers and a Metal Core A high vacuum magnetron sputtering device is utilized to deposit, in a sequence of, a bottom buffering conductive layer 1 Ta of 2 nm thick, a first anti-ferromagnetic pinning layer 81 IrMn of 10 nm thick, a first pinned magnetic layer 91 CoFeB of 5 nm thick, a first intermediate layer 31 Al2O3 of 1 nm thick, a soft magnetic layer 4 Co of 1 nm thick, a second intermediate layer 32 Al2O3 of 1 nm thick, a second pinned magnetic layer 92 CoFeB of 5 nm thick, a second anti-ferromagnetic pinning layer 82 IrMn of 10 nm thick and a capping layer 5 Ru of 4 nm on a $SiO_2$/Si substrate of 1 mm thick which has been cleansed by conventional method. The growing condition of above magnetic multilayer film: background vacuum: $5\times10^{-7}$ Pa; the pressure of high purity argon for sputtering: 0.07 Pa; sputtering power: 120 W; spinning speed of sample-shelf: 20 rmp; growing temperature, room temperature; growing speed: 0.3-1.1 Å/s; growing period: film thickness/growing speed; a 50 Oe plane inducing magnetic field is applied when depositing the first anti-ferromagnetic pinning layer 81, the second anti-ferromagnetic pinning layer 82, the first pinned magnetic layer 91, the second pinned magnetic layer 92 and the soft magnetic layer 4. The micro-fabrication techniques in prior art are applied to the deposited magnetic multilayer film, i.e. after resist coating and pre-baking, the substrate is exposed on an electron beam lithography machine according to the required pattern of closed elliptic ring. Then the next procedures are developing, fixing and post-baking, after which the magnetic multilayer film is etched into a closed shape via ion etching method. At last, the geometric structure of closed elliptic ring is formed after the resist is stripped off by dipping into stripping chemicals. The interior diameter of the minor axis of the elliptic ring is 500 nm, the exterior diameter of the minor axis is 800 nm, the interior diameter of the major axis is 2500 nm, the exterior diameter of the major axis is 2800 nm, and the ratio of the interior diameter of the minor axis vs. that of major axis of the elliptic ring is 1:5. Then the conventional film growing methods such as magnetron sputtering, electron beam evaporation, pulse laser deposition, electrochemical deposition, molecular beam epitaxy, etc. are adopted to deposit a $SiO_2$ insulation layer of 50 nm thick on the etching-formed closed magnetic multilayer film to bury each closed ring multilayer film while keeping them separated. Next, the micro-fabrication techniques in prior art are adopted for etching, i.e. first, the focusing ion beam device is positioned to the geometric center of the ring multilayer film, then the method of focusing ion beam etching is used to etch the $SiO_2$ insulation layer to form a cylindrical hole, whose cross section is elliptic, wherein the diameter of minor axis of the ellipse is 300 nm, the ration of minor axis vs. major axis is 1:5, and then focusing ion beam assisted deposition method is used to deposit metal material Au in the hole to form a Au metal core 6, the cross section of which is an ellipse, and the shape of cross section is as described above. Next, the micro-fabrication techniques in prior art are adopted for etching, i.e. first, the focusing ion beam device is positioned to the place where the closed ring multilayer film is deposited, then the $SiO_2$ insulation layer is etched via focusing ion beam etching method to expose the closed magnetic multilayer film buried under the insulation layer. Lastly, a conductive layer Cu of 100 nm thick is deposited via high vacuum magnetron sputtering device, the growing condition of which is as described above. And the electrode is prepared via conventional semiconductor micro-fabrication techniques, i.e. after resist coating and pre-baking, it is exposed on an ultraviolet, extreme ultraviolet exposing machine via a mask with desired patterns, then after developing, fixing and post-baking, the conductive layer on the magnetic multilayer film is etched into the shape of four electrodes through ion etching method. And at last, the closed elliptic ring shaped magnetic tunnel junction with double intermediate layers and a metal core is obtained after the resist is stripped off by dipping into stripping chemicals. The schematic diagram of its structure is shown in FIG. 8.

Embodiment 65

Figure 9A:
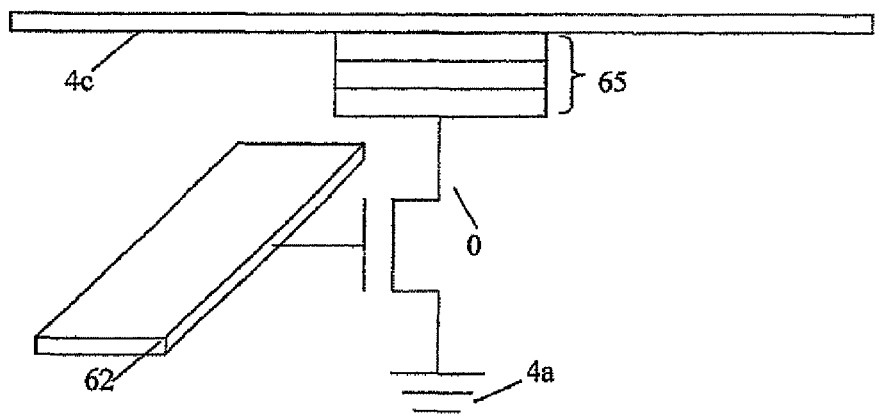
Figure 9B:
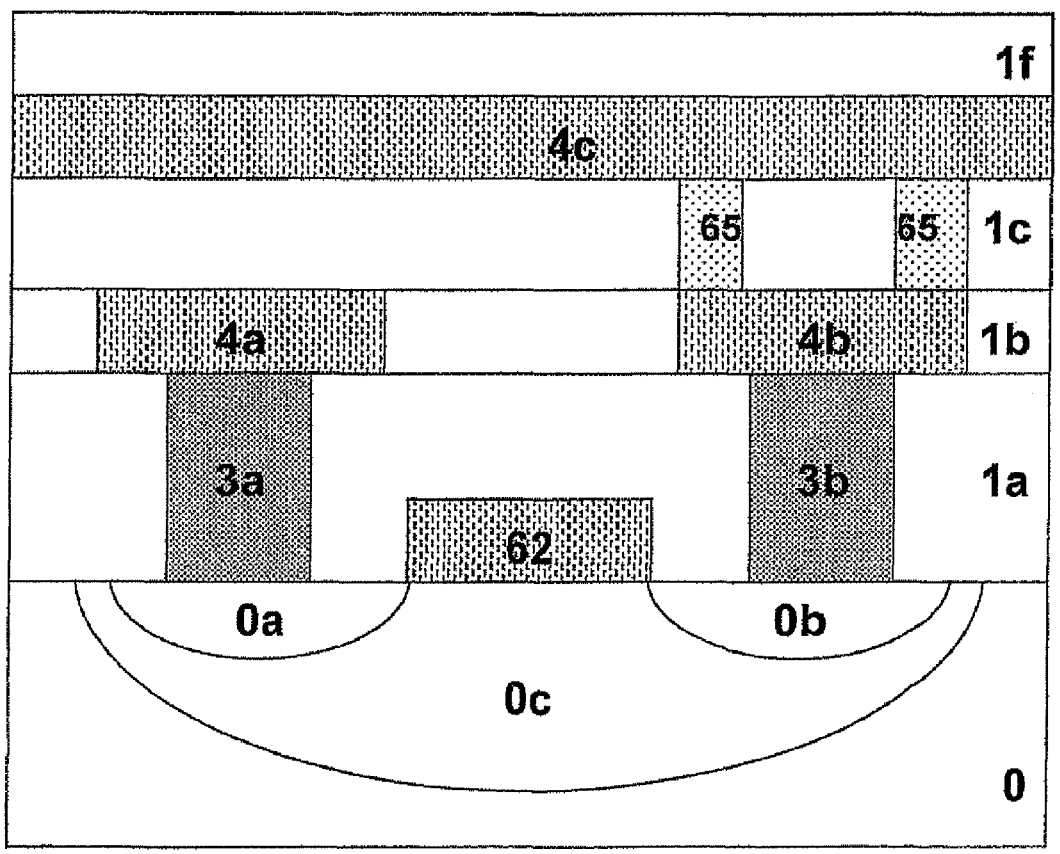
Figure 9C:
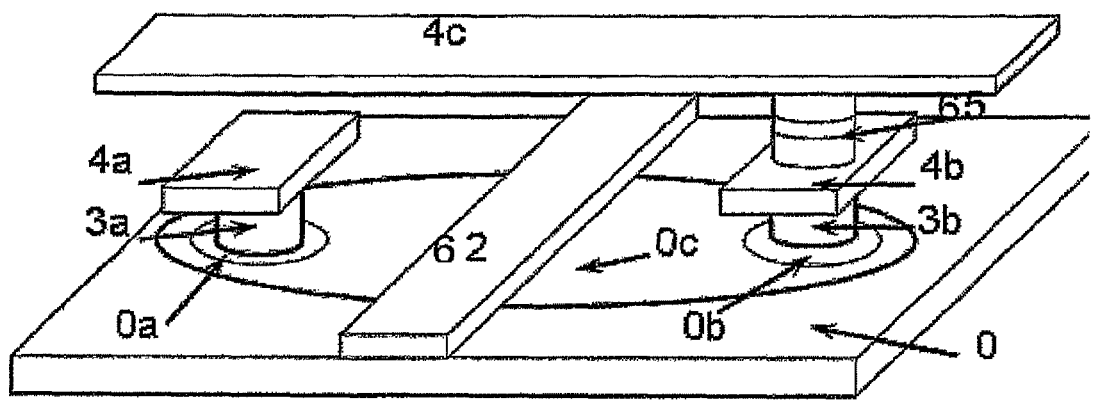

As shown in FIG. 9A-C, the memory cell array of magnetic random access memory is comprised of a large number of MRAM cells. A MRAM cell includes a memory cell (RML) 65 of closed elliptic magnetic multilayer film, a transistor (TR) 0, a first transitional metal layer (TM) 4b, contact holes (3a, 3b) and a set of lines, i.e. bit line (BL) 4c, word line (WL) 62 and ground fine (GND) 4a.

The structure of the magnetic multilayer film in the closed elliptic magnetic multilayer film memory cell (RML) 65 is: a bottom buffering conductive layer 1 Au of 2 nm thick, a hard magnetic layer (HFM) 2 CoFe of 5 nm thick, an intermediate layer (I) 3 Cu of 1 nm thick, a soft magnetic layer (SFM) 4 NiFe of 1 nm thick, a capping layer 5 Ru of 4 nm thick and a conductive layer Au of 10 nm thick, which all grow on the first transitional metal layer (TM) 4b. The preparation of closed structure has been given in detail in another patent application. The interior diameter of minor axis of the elliptic ring is 500 nm, the exterior diameter of the minor axis is 800 nm, the interior diameter of the major axis is 2500 nm, the exterior diameter of the major axis is 2800 nm, and the ratio of minor axis vs. major axis of the elliptic ring is 1:5.

The closed elliptic magnetic multilayer film memory cell (RML) 65 and transistor (TR) 0 are interconnected via the first transitional metal layer (TM) 4b and the contact hole (3b). The bit line (BL) 4c is disposed above the closed elliptic ring magnetic multilayer film memory cell RML (65) and is directly connected to the closed magnetic multilayer film memory cell (RML) 65.

As shown in FIG. 9B, the whole MRAM cell is composed of several layers such as 1a, 1b, 1c, 1f. The non-function regions in these layers are buried by insulative burying medium such as $SiO_2$. The metal wiring layer in the MRAM cell has only two layers, i.e. bit line (BL) 4c, and ground line (GND) 4a and the first transitional metal layer (TM) 4b. The closed magnetic multilayer film memory cell (RML) 65 is disposed below the bit line (BL) 4c and the upper electrode of which is directly connected with the bit line (BL) 4c; the lower electrode of the closed magnetic multilayer film memory cell (RML) 65 is connected to the drain (0b) of the transistor (TR) 0 via the transitional metal layer (TM) 4b and contact hole (3b).

In the reading and writing operation of MRAM, according to the spin torque effect presented in the background techniques, when the current in the bit line (BL) 4c is smaller than the low threshold value $I_{C1}$ (corresponding current density $J_{C1}=10^2/cm^2$, current=current density×area of cross section of closed magnetic multilayer film), the current in bit line (BL) 4c will not change the magnetic state of the closed magnetic multilayer film memory cell (RML) 65, therefore to realize the reading operation of when the current in bit line (BL) 4c is larger than the low threshold value $I_{C1}$ but smaller than the high threshold value $I_{C2}$ (corresponding current density $J_{C2}=10^5$ A/cm², current=current density×area of cross section of closed magnetic multilayer film), the direction in the bit line (BL) 4c will define the magnetic state of the bit layer (soft magnetic layer or soft magnetic layer) in the closed magnetic multilayer film memory cell (RML) 65, which makes the magnetic states of bit layer (soft magnetic layer or soft magnetic layer) and the pinned magnetic layer (or hard magnetic layer) are same or opposite along the clockwise or counter-clockwise direction (i.e. magnetization intensity is parallel or anti-parallel), thus two states of low resistance and high resistance can be obtained (i.e. obtaining two states of high output voltage and low output voltage), that is to say, the writing operation of MRAM can be realized via control of the current direction. This is the working principle of the MRAM of present embodiment which utilizes spin torque effect.

Therefore, for the example shown in FIGS. 9A, 9D, during the addressing reading operation of MRAM, an appropriate electrical current is provided by the selected word line (WL) 62 to turn the transistor (TR) 0 on, then a readout current smaller than the low threshold value $I_{C1}$ is conducted by the selected bit line (BL) 4c, the readout current flows from bit line BL1 (4c), and passes through closed magnetic multilayer film memory cell (RML) 65, the first transitional metal layer (TM) 4b, contact hole (3b), the drain (0b) of transistor (TR) 0, the source (0a) of transistor TR (0), the contact hole (3a), until finally reaches the ground line GND (4a) to obtain the present magnetic state of the bit layer (soft magnetic layer or soft magnetic layer) in the closed magnetic multilayer film memory cell (RML) 65, i.e. the data stored in the MRAM cell; during the addressing writing operation of MRAM, an appropriate electrical level is provided by the selected word line (WL) 62 to turn the transistor (TR) 0 on, then a writing current larger than the low threshold $I_{C1}$ while smaller than the high threshold value $I_{C2}$ is conducted by the selected bit line (BL) 4c, due to the influence of spin torque effect, the magnetic state of the closed magnetic multilayer film memory cell (RML) 65 is defined by the writing current direction, therefore, after the writing current flows from bit line (BL) 4c, passes through the closed magnetic multilayer film memory cell (RML) 65, the first transitional metal layer (TM) 4b, contact hole (3b), the drain (0b) of transistor (TR) 0, the source (0a) of transistor (TR) 0, contact hole (3a), until finally reaches the ground line GND (4a), the magnetic state of the bit layer (soft magnetic layer) in the closed magnetic multilayer film memory cell (RML) 65 is written in by the writing current, thus the data is written into the MRAM cell.

Embodiment 66

As shown in FIG. A-C, the memory cells array in a magnetic random access memory is composed of large number of MRAM cells. A MRAM cell includes a closed elliptic ring magnetic multilayer film memory cell 65, a metal core 6 disposed in the geometric center of the closed elliptic ring magnetic multilayer film memory cell 65, a transistor 0, a first transitional metal layer 4b, contact holes (3a, 3b) and a set of wirings, i.e. the first bit line 4e, second bit line 4d, word line 62 and ground line 4a. The close elliptic ringed magnetic multilayer film memory cell 65 and the transistor 0 are interconnected via the first transitional metal layer 4b and the contact hole 3b. The second bit line 4d is disposed above the closed elliptic ring magnetic multilayer film memory cell 65 and is directly connected therewith. The first bit line 4e is disposed above and parallel to the second bit line 4d, and they are separated by an insulative layer 1e.

The structure of the magnetic multilayer film in the closed elliptic ring magnetic multilayer film memory cell 65 is: a bottom buffering conductive layer 1 Cr of 10 nm thick, an anti-ferromagnetic pinning layer 8 PtMn of 10 nm thick, a pinned magnetic layer 9 $Ni_{79}Fe_{21}$ of 2 nm thick, an intermediate layer (I) 3 TiO of 0.8 nm thick, a soft magnetic layer 4 $Ni_{79}Fe_{21}$ of 1 nm thick and a capping layer 5 Pt of 2 nm thick, which all grows on the first transitional metal layer 4b. The interior diameter of the minor axis of the elliptic ring is 500 nm, the exterior diameter of the minor axis is 800 nm, the interior diameter of the major axis is 2500 nm, the exterior diameter of major axis is 2800 nm, the ratio of the interior diameter of minor axis and major axis of elliptic ring is 1:5. The metal core 6 disposed in the geometric center of the closed magnetic multilayer film memory cell 65 is a Au metal core, the cross section of which is an ellipse, and the minor axis of the ellipse is 300 nm, the ratio of the width of the short side and long side is 1:5.

As is shown in FIG. 10B, the whole cell is composed of several layers such as 1a, 1b, 1c 1e, 1f, the non-function region in these layers are buried by insulative burying medium such as $SiO_2$. The metal wiring layer in MRAM cell has only three layers, i.e. a first bit line 4e, a second bit line 4d, and ground line GND 4a and the first transitional metal layer 4b. the closed magnetic multilayer film memory cell 65 is disposed above the second bit line 4d and the upper electrode of which is directly connected with the first bit line 4e; the lower electrode of the closed magnetic multilayer film memory cell 65 is connected with the drain 0b of the transistor 0 via the first transitional metal layer 4b and contact hole 3b; the metal core 6 disposed in the geometric center of the closed magnetic multilayer film memory cell 65 is directly connected with the first bit line 4e at the top and the first transitional metal layer 4b at the bottom.

Therefore, for the example of FIGS. 10A, 10B, during the addressing readout operation of MRAM, an appropriate electrical current is provided by the selected word lime 62 to turn the transistor 0 on, then a readout current (corresponding current density $J_{C1}=10^2$ A/cm² current=current density×area of cross section of closed magnetic multilayer film) smaller than the low threshold value $I_{C1}$ is conducted by the selected second bit line 4d, and the readout current flows from the second bit line, passes through the closed magnetic multilayer film memory cell 65, the first transitional metal layer 4b, the contact hole 3b, the source 0b of the transistor 0, the drain 0a of the transistor 0, the contact hole 3a, and finally reaches the ground line 4a, to obtain the present magnetic state of the bit layer (soft magnetic layer or soft magnetic layer) in the closed magnetic multilayer film memory cell 65, i.e. the data stored in the MRAM cell; during the addressing writing operation, an appropriate electrical level is provided by the selected word line 62 to turn the transistor 0 on, then a writing current (corresponding current density $J_{C2}=10^5$ A/cm², current=current density×area of cross section of metal core) larger than the low threshold $I_{C1}$ and smaller than the high threshold $I_{C2}$ is conducted by the selected first bit line 4e. Since the magnetic field created by the writing current is also distributed in a ring, the magnetic state of the bit layer (soft magnetic layer 4) in the closed magnetic multilayer film memory cell 65 can be controlled to orient clockwise or counter-clockwise, so that the magnetic states of the bit layer (soft magnetic layer 4) and pinned magnetic layer 9 are same or opposite along the clockwise or counter-clockwise direction (i.e. the magnetization is parallel or anti-parallel). Thus, two states of low resistance and high resistance are obtained (i.e. two states of high output voltage and low output voltage are obtained), that is to say the writing operation of MRAM can be realized via control of the current direction. After the writing current flows from the first bit line 4e, and passes through the metal core 6, the first transitional metal layer 4b, the contact hole 3b, the source 0b of transistor 0, the drain 0a of transistor 0, contact hole (3a), and finally reaches the ground line 4a, the magnetic state of the bit layer (soft magnetic layer 4) in the closed magnetic multilayer film memory cell 65 is writing in along with the writing current, thus the data is written into the MRAM cell.

Embodiment 67

Figure 11A:
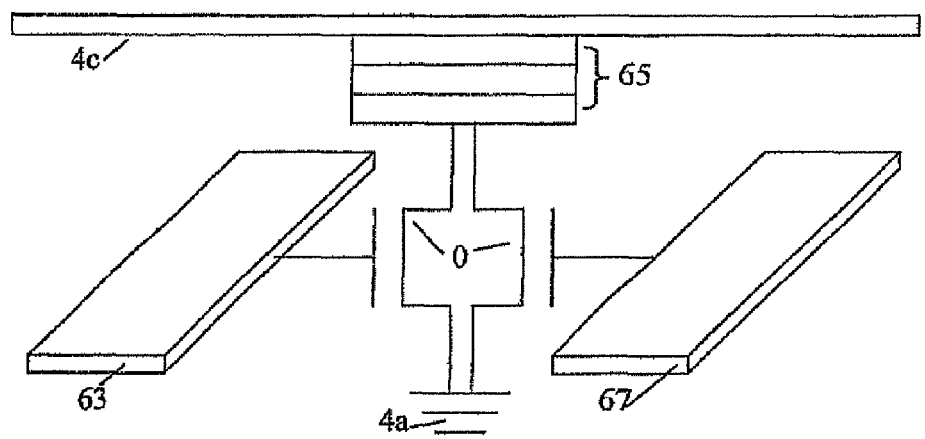
Figure 11B:
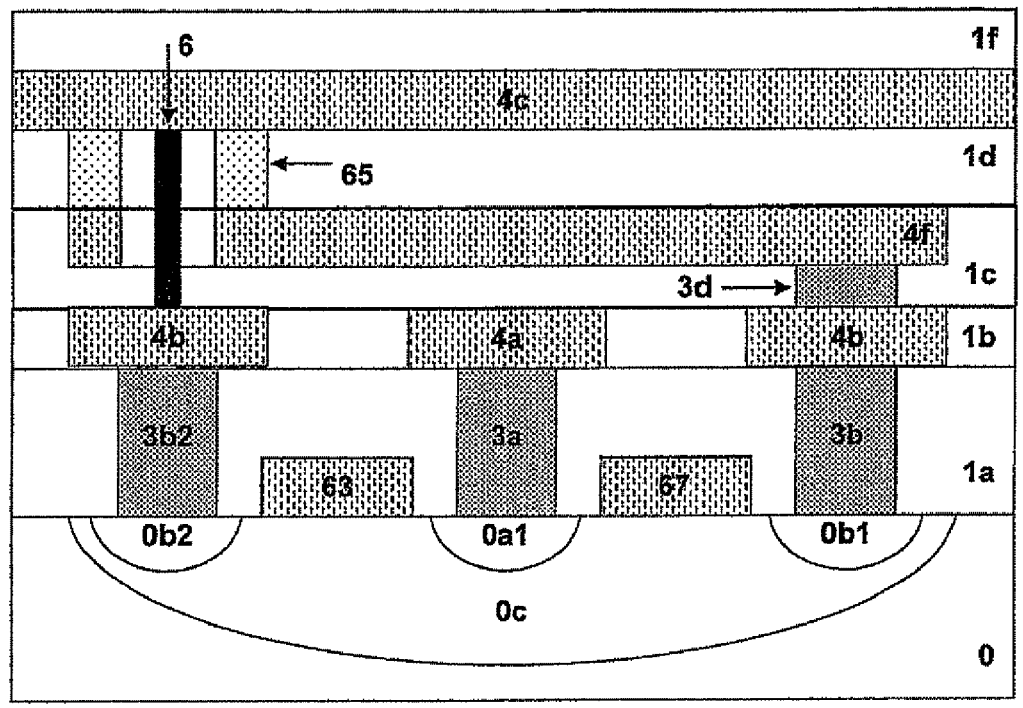
Figure 11C:
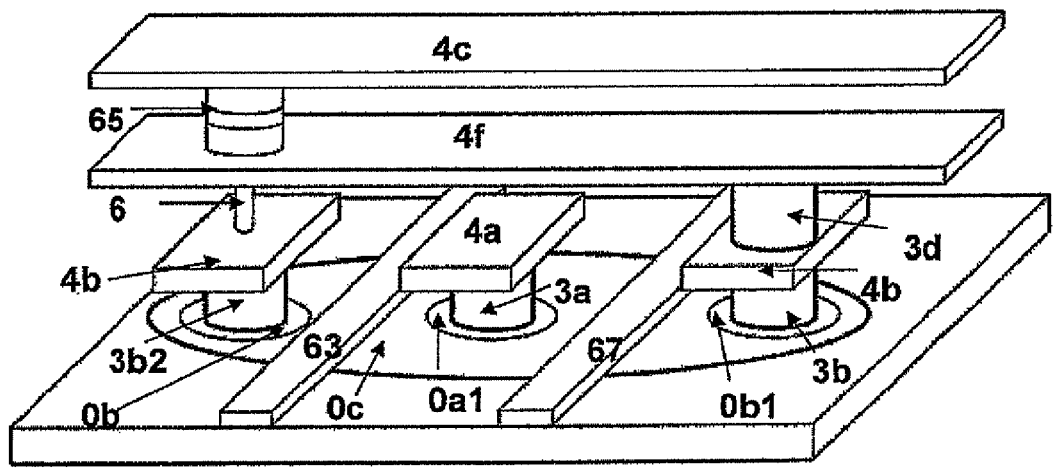

As is shown in FIG. 11A-C, the memory cell array of magnetic random access memory is composed of large number of MRAM cells. A MRAM cell includes a closed elliptic ring magnetic multilayer film memory cell 65, a metal core 6 disposed in the geometric center of the closed elliptic ring magnetic multilayer film memory cell 65, a transistor 0, a first transitional metal layer 4b, a ground line 4a, contact holes (3a, 3b, 3b2) and a set of wiring, i.e. bit line 4c, the second word line 63, the first word line 67 and ground line 4a. The closed elliptic ring magnetic multilayer film memory cell 65 and the transistor 0 are interconnected via the first transitional metal layer 4b and the contact hole 3b. The bit line 4c is disposed above the closed elliptic ring magnetic multilayer film memory cell 65 and directly connected therewith.

The structure of the magnetic multilayer film in the closed elliptic magnetic multilayer film memory cell 65 is that a bottom buffering conductive layer 1 Ta of 2 nm thick, an anti-ferromagnetic pinning magnetic layer 8 IrMn of 5 nm thick, a pinned magnetic layer (FM) 9 CoPeB of 2 nm thick, an intermediate layer (I) 3 $Al_2O_3$ of 0.8 nm thick, a soft magnetic layer (FM) 4 CoFeB of 1 nm thick and a capping layer 5 Ta of 2 nm thick are deposited on the second transitional metal layer 4f in sequence. The interior diameter of the minor axis of the elliptic ring is 1000 nm, the exterior diameter of the minor axis is 2000 nm, the interior diameter of the major axis is 5000 nm, the exterior diameter of the major axis is 6000 nm n, and the ratio of interior diameter of the minor axis vs. major axis of the elliptic ring is 1:5. The metal core 6 disposed in the geometric center of the closed elliptic ring magnetic multilayer film memory cell 65 is Au metal core 6, the cross section of which is an ellipse. The minor axis of the ellipse is 500 nm, and the ratio of the width of short side vs. long side is 1:5.

As shown in FIG. 11B, the whole MRAM cell is composed of several layers such as 1a, 1b, 1c, 1d, 1f. The non-function regions in these layers are buried by the insulating layer such as $SiO_2$. The metal wiring layer in the MRAM cell has only three layers i.e. bit line 4c, the second transitional metal layer 4f, and the first transitional metal layer 4b. The closed magnetic multilayer film memory cell 65 is disposed below the bit line 4c and the upper electrode of which is directly connected with the bit line 4c; the lower electrode of the closed magnetic multilayer film memory cell 65 is connected to the first drain 0b1 of the transistor 0 via the first transitional metal layer 4b, the contact hole 3b and the contact hole 3d. The metal core 6 disposed in the geometric center of the closed magnetic multilayer film memory cell 65 is directly connected to the bit line 4c at the top and the second transitional metal layer 4f at the bottom. The transistor 0 is composed of two work regions, they share a common drain 0a1, the sources of the first and second transistor are 0b1 and 0b2 respectively. The working state of the two transistors is respectively controlled by the electrical level provided by the first word line 67 and second word line 63 disposed above the grid.

Therefore, for the example of FIGS. 11A, 11B during the addressing readout operation of MRAM, an appropriate electrical level is provided by the selected first word line 67 to turn on the first transistor of the transistor 0. Then a readout current (corresponding current density $J_{C1}=10^2$ A/cm$^2$, current=current density×area of cross section of the closed magnetic multilayer film) smaller than the low threshold $I_{C1}$ is conducted by the selected bit line 4c. And the readout current flows from the bit line 4c, passes through the closed magnetic multilayer film memory cell 65, the second transitional metal layer 4f, the contact hole 3b, the first transitional metal layer 4b, the contact hole 3b, the first source 0b1 of the transistor 0, the common drain 0a1 of the transistor 0 and the contact hole 3a, and finally reaches the ground line 4a, to obtain the present magnetic state of the bit layer (soft magnetic layer 4) in the closed magnetic multilayer film memory cell 65, i.e. the data stored in MRAM cell. During the addressing writing in operation of MRAM, an appropriate electrical level is provided by the selected second word line 63 to turn on the second transistor of transistor 0. Then a writing current (corresponding current density $J_{C2}=10^5$ A/cm$^2$, current=current density×area of cross section of the closed magnetic multilayer film) larger than the low threshold $I_{C1}$ and smaller than the high threshold $I_{C2}$ is conducted by the selected bit line 4c. Since the magnetic field created by the writing current is annularly distributed, the magnetic state of the bit layer (soft magnetic layer 4) in the closed magnetic multilayer film memory cell 65 can be controlled to orient clockwise or counter-clockwise, so that the magnetic states of the bit layer (soft magnetic layer 4) and the pinned magnetic layer 9 are same or opposite (i.e. the magnetization is parallel or anti-parallel) along the clockwise or counter-clockwise direction respectively. Thus two states of low resistance and high resistance (i.e. two states of high output voltage and low output voltage are obtained) are obtained, that is to say that the writing operation of MRAM can be realized via control of the current direction. After the writing current flows from bit line 4c, passes through metal core 6, first transitional metal layer 4b, contact hole 3b2, the second source 0b2 of transistor 0, the common drain 0a of transistor 0, contact hole 3a, and until finally reaches the ground line 4a, the magnetic state of the bit layer (soft magnetic layer 4) in the closed magnetic multilayer film memory cell 65 is written in along with the writing current, thus the data is written into the cell.

It is worth to point out that that, in present embodiment, the closed shape can be a square ring, a rectangular ring, a triangle ring, a hexagonal ring, or a pentagonal ring. The magnetic multilayer of present embodiment can be of other structures described in the above. Moreover, the size of the ring, the diameter of the core and the materials composing the ring have all been applied for patent, which will not be described in detail.

The invention claimed is:

1. A geometric shaped magnetic multilayer film, including each layer of a conventional magnetic multilayer film deposited on a substrate, characterized in that: the cross section of said magnetic multilayer film is a closed elliptic ring, the magnetic moment or flux of the ferromagnetic thin film in the magnetic multilayer film is in clockwise or counter-clockwise closed state; wherein the interior minor axis of the elliptic ring shaped magnetic multilayer's cross section is 10-100000 nm, the ratio of minor axis vs. major axis is 1:1-1:5, the exterior minor axis of the ellipse is 20-200000 nm, and the width of the ring is 10-100000 nm.

2. The geometric shaped magnetic multilayer film according to claim 1, characterized in that said elliptic ring whose ratio of minor axis vs. major axis equals 1:1 is a circular ring.

3. The geometric shaped magnetic multilayer film according to claim 1, characterized in that the magnetic multilayer film whose cross section is elliptic shaped is non-pinning magnetic multilayer film, including a buffering conductive layer, a hard magnetic layer, an intermediate layer, a soft magnetic layer and a capping layer;
Said buffering conductive layer is composed of metal materials, and the thickness is 2-200 nm;
Said hard magnetic layer is composed of giant magneto resistance materials, and the thickness is 2-20 nm;
Said intermediate layer comprising non-magnetic metal layer or insulation potential barrier layer, the thickness of the intermediate layer is 0.5-10 nm;
The component materials of said soft magnetic layer are ferromagnetic materials with high spin polarization and low coercive force, and the thickness of said soft magnetic layer is 1-20 nm;
Said capping layer is composed of non-oxidable metal materials, and the thickness is 2-20 nm.

4. The geometric shaped magnetic multilayer film according to claim 3, characterized in that:
The component materials of said buffering conductive layer are Ta, Ru, Cr, Au, Ag, Pt, Ta, W, Ti, Cu, Al, or Si—Al alloys;
The component materials of said hard magnetic layer are Co, Fe, Ni, CoFe, NiFeCo, CoFeB or CoFeSiB;
The non-magnetic metal layer of said intermediate layer is Ti, Zn, ZnMn, Cr, Ru, Cu, V or TiC; said insulation potential barrier layer of the intermediate layer is $Al_2O_3$, MgO, TiO, ZnO, (ZnMn)O, CrO, VO, or TiCO;
The component materials of said soft magnetic layer are Co, Fe, Ni or the metal alloys thereof, the alloys are NiFe, CoFeSiB or NiFeSiB, or non-crystal $CO_{100-x-y}Fe_xB_y$, wherein $0<x<100$, $0<y\leqq20$, or $CO_2MnSi$, $CO_2Cr_{0.6}Fe_{0.4}Al$;
The component materials of said capping layer are Ta, Cu, Ru, Pt, Ag, Au, Cr or the alloys thereof.

5. The geometric shaped magnetic multilayer film according to claim 1, characterized in that: the closed magnetic multilayer film is pinning magnetic multilayer film, including a buffering conductive layer, an anti-ferromagnetic pinning layer, a pinned magnetic layer, an intermediate layer, a soft magnetic layer and a capping layer;
said buffering conductive layer is composed of metal materials, the thickness is 2-200 nm;
said anti-ferromagnetic pinning layer is composed of anti-ferromagnetic alloys, the thickness is 3-30 nm;
said pinned magnetic layer is composed of ferromagnetic metals of high spin polarization, and the thickness is 2-20 nm;
said intermediate layer is composed of non-magnetic metal layer or insulation potential barrier layer, the thickness of the intermediate layer is 0.5-10 nm;
said soft magnetic layer is composed of ferromagnetic materials of high spin polarizability and low coercive force, and the thickness is 1-20 nm;
said capping layer is composed of non-oxidable metal materials, and the thickness is 2-20 nm.

6. The geometric shaped magnetic multilayer film according to claim 5, characterized in that:
The component materials of said buffering conductive layer are Ta, Ru, Cr, Au, Ag, Pt, Ta, W, Ti, Cu, Al, or Si—Al alloys;
The component materials of said antiferromagnetic pinning layer are IrMn, FeMn, PtMn, CrMn, or Pt (Cr, Mn) alloys; The component materials of said pinned magnetic layer are Fe, Co, Ni or the alloys thereof;
The non-magnetic metal layer of said intermediate layer is Ti, Zn, ZnMn, Cr, Ru, Cu, V or TiC; said insulation potential barrier layer of the intermediate layer is $Al_2O_3$, MgO, TiO, ZnO, (ZnMn)O, CrO, VO, or TiCO;
The component materials of said soft magnetic layer are Co, Fe, Ni or the metal alloys thereof, or non-crystal $CO_{100-x-y}Fe_xB_y$, wherein $0<x<100$, $0<y\leqq20$, or NiFeSiB, or Heusler alloys;
The component materials of said capping layer are Ta, Cu, Ru, Pt, Ag, Au, Cr or the alloys thereof.

7. The magnetic multilayer film according to claim 1, characterized in that: said closed magnetic multilayer film is non-pinning closed ring magnetic multilayer film with double intermediate layers, including: a buffering conductive layer, a first hard magnetic layer, a first intermediate layer, a soft magnetic layer, a second intermediate layer, a second hard magnetic layer, and a capping layer;
Said buffering conductive layer is composed of metal materials, and the thickness of which is 2-200 nm;
Said first and second hard magnetic layers are composed of materials having large giant magneto resistance effect, and the thickness of which is 2-20 nm;
Said first and second intermediate layers are composed of non-magnetic metal layer or insulation potential barrier layer, and the thickness of the intermediate layer is 0.5-10 nm;
Said soft magnetic layer is composed of ferromagnetic materials having high spin polarizability and low coercive force, and the thickness of which is 1-20 nm;
Said capping layer is composed of non-oxidable metal materials, and the thickness is 2-20 nm.

8. The magnetic multilayer film according to claim 7, characterized in that:
The component materials of said buffering conductive layer are Ta, Ru, Cr, Au, Ag, Pt Ta, W, Ti, Cu, Al, or Si—Al alloys;
The component materials of said first and second hard magnetic layer are Co, Fe, Ni, CoFe, NiFeCo, CoFeB or CoFeSiB;
The non-magnetic metal layer of said first and second intermediate layer are Ti, Zn, ZnMn, Cr, Ru, Cu, V, or TiC; the insulation potential barrier layer of said intermediate layer is $Al_2O_3$, MgO, TiO, ZnO, (ZnMn)O, CrO, VO, or TiCO;
The component materials of said soft magnetic layer are Co, Fe, Ni or their metal alloy NiFe, CoFeSiB, NiFeSiB, or non-crystal $Co_{100-x-y}Fe_xB_y$, where $0<x<100$, $0<y\leqq20$, or $CO_2MnSi$, $CO_2Cr_{0.6}Fe_{0.4}Al$;
The component materials of said capping layer are Ta, Cu, Ru, Pt, Ag, Au, Cr or the alloys thereof.

9. The magnetic multilayer film according to claim 1, characterized in that: said closed magnetic multilayer film is pinning closed ring magnetic multilayer film with double intermediate layers, including: a buffering conductive layer, a first antiferromagnetic pinning layer, a first pinned magnetic layer, a first intermediate layer, a soft magnetic layer, a second intermediate layer, a second pinned magnetic layer, a second antiferromagnetic pinning layer, and a capping layer;
Said buffering conductive layer is composed of metal materials, and the thickness is 2-200 nm;
Said first and second anti-ferromagnetic pining layer are both composed of anti-ferromagnetic alloys, the thickness of which is 3-30 nm;

Said first and second pinned magnetic layer are composed of ferromagnetic metals with high spin polarizability, and the thickness is 2-20 nm;

Said first and second intermediate layer are composed of a non-magnetic metal layer or an insulation potential barrier layer, and the thickness of the intermediate layer is 0.5-10 nm;

Said soft magnetic layer is composed of ferromagnetic materials having high spin polarizability and low coercive force, and the thickness is 1-20 nm;

Said Capping layer is composed of non-oxidable metal materials, the thickness of which is 2-20 nm.

10. The magnetic multilayer film according to claim 9, characterized in that:

The component materials of said buffering conductive layer are Ta, Ru, Cr, Au, Ag, Pt, Ta, W, Ti, Cu, Al, or Si—Al alloys;

The component materials of said first and second anti-ferromagnetic pinning layer are IrMn, FeMn, PtMn, CrMn or Pt (Cr, Mn) alloys;

The component materials of said first and second pinned magnetic layer are Fe, Co, Ni or the alloys thereof;

The component materials of the non-magnetic metal layer of said first and second intermediate layer are Ti, Zn, ZnMn, Cr, Ru, Cu, V or TiC; the component materials of the insulation potential barrier layer of said intermediate layer are $Al_2O_3$, MgO, TiO, ZnO, (ZnMn)O, CrO, VO, or TiCO;

The component materials of said soft magnetic layer are Co, Fe, Ni or the alloys thereof, or non-crystal $Co_{100-x-y}Fe_xB_y$, wherein $0<x<100$, $0<y\leq20$, or NiFeSiB, or Heusler alloys;

The component materials of said capping layer are Ta, Cu, Ru, Pt, Ag, Au, Cr, or the alloys thereof.

11. A magnetic random access memory made of magnetic multilayer film magnetic memory cells according to claim 1, 3, 5, 7, or 9, including:

Memory reading and writing control unit array composed of transistor units, the reading and writing control unit array being integrated in the semiconductor substrate;

Memory cells and the array thereof;

A transitional metal layer connecting the said transistor units with the magnetic multilayer film memory cells;

And word line, bit line and ground line, said word line being also the grid of said transistor, said bit line being disposed above said magnetic multilayer film memory cells, vertical to said word line, and connecting to said magnetic multilayer film memory cells directly; characterized in: the cross section of the magnetic multilayer film in said magnetic multilayer film memory cells is a closed elliptic ring, the diameter of minor axis of the interior closed elliptic ring is 10-10000 nm, the ratio of minor axis vs. major axis is 1:1-1:5, the diameter of minor axis of the exterior closed elliptic ring is 20-200000 nm, the width of the ring is 10-100000 nm; the elliptic ring whose ratio of minor axis vs. major axis is 1:1 is a circular ring.

12. A method of accessing the magnetic random access memory of closed magnetic multilayer film of claim 11, which realizes the reading and writing operation of MRAM by control of the current magnitude and direction flowing through the memory cell RML, the method including the following steps:

controlling the current flowing through the memory cell RML of closed magnetic multilayer film smaller than the low threshold I.sub.C1, the magnetic state of bit layer will not change, thus the reading operation of MRAM is realized, said bit layer is soft magnetic layer;

controlling the current flowing through the memory cell RML of closed magnetic multilayer film to make it larger than the low threshold I.sub.C1, and smaller than high threshold I.sub.C2, the magnetic state of the bit layer in memory cell RML of closed magnetic multilayer film will be changed by the current direction, the magnetic state of its bit layer is oriented clockwise or counter-clockwise by the positive and negative spin polarized tunneling current, i.e, the combined effect of the driving action and spin torque of the ring shaped magnetic field induced by the polarized tunneling current, so that the magnetic states of the bit layer and pinned magnetic layer or hard magnetic layer are same or opposite along the clockwise or counter-clockwise direction, i.e, the magnetization are parallel or counter-parallel, thus two states of low and high resistance are obtained, i.e, the two states of high output voltage and low output voltage, thus, the writing operation of EM can be realized by control of the current magnitude and direction;

said low threshold $I_{C1}$=current density $J_{C1}$×area of cross section of closed magnetic multilayer film, current density $J_{C1}=10-10^2$ A/cm$^2$;

said high threshold $I_{C2}$=current density $J_{C2}$×area of cross section of closed magnetic multilayer film, current density $J_{C2}=10^2-10^6$ A/cm$^2$.

13. Method of preparing said magnetic multilayer film in claim 1, including following steps:

1) Selecting a substrate, on which, after the cleaning with conventional method, depositing a bottom buffering conductive layer in a conventional film growth device;

2) Depositing each layer of the magnetic multilayer film in sequence on the bottom buffering conductive layer with conventional film growth method; when depositing the magnetic layer, a plane inductive magnetic field of 50-50000e is selectively applied;

3) Processing the substrate on which the magnetic multilayer film is deposited in step 2) into structure of closed circular ring or elliptic ring by techniques of microfabrication;

The detailed steps of said micro-fabrication are: after coating resist and pre-baking, according to the required closed patterns the substrate is exposed on an ultraviolet, extreme ultra-violet exposing machine or electron beam exposing machine, then after developing, fixing and post-baking, the magnetic multilayer film is etched into closed shape by ion etching method, and at last, the resist is stripped off by dipping into stripping chemicals;

4) Depositing a 100-1000 nm insulation layer on the etching formed closed magnetic multilayer film of step 3) by conventional film growth method to bury each closed ring shaped multilayer film and separated into different cells;

5) Etching the insulation layer at the position where the closed multilayer film is deposited, to expose the magnetic multilayer film buried under the insulation layer, by ultraviolet, extreme ultraviolet lithography or electron beam lithography of micro-fabrication techniques and focusing ion beam etching or chemical reaction dry etching or chemical reaction wet etching, so that the closed magnetic multilayer film of present invention is obtained.

14. A geometric shaped magnetic multilayer film including each layer of a conventional magnetic multilayer film deposited on a substrate, characterized in: the cross section of said magnetic multilayer film is a closed elliptic ring, the geometric shaped magnetic multilayer film further includes a metal core which is positioned at the geometric center of said magnetic multilayer film and has a cross section of corresponding shape; the magnetic moment or flux of the ferromagnetic thin film in the magnetic multilayer film is in clockwise or counter-clockwise closed state.

15. The magnetic multilayer film according to claim 14, characterized in: the minor axis of said elliptic metal core is 5-50000 nm, the ratio of minor axis vs. major axis of the ellipse is 1:1-1:5.

16. The closed magnetic multilayer film with a metal core according to claim 15, characterized in: the materials of said metal core are Au, Ag, Pt, Ta, W, Ti, Cu, Al or Si—Al alloys.

17. Method of preparing closed magnetic multilayer film with a metal core according to claim 14, including following steps:
   1) Selecting a substrate, and depositing the bottom buffering conductive layer in a conventional film growth device after the substrate being cleaned via conventional method, the bottom buffering conductive layer will become conductive electrodes in subsequent fabrication process;
   2) Depositing each layer of the magnetic multilayer film in sequence on the bottom buffering conductive layer by conventional film growth method; when depositing the magnetic layer, a plane inductive magnetic field of 50-5000Oe is selectively applied;
   3) Processing the substrate on which the magnetic multilayer is deposited in step 2) into structure of a closed circular ring or elliptic ring by techniques or method of micro-fabrication;
   The detailed steps of micro-fabrication are: after coating resist and pre-baking, according to the required closed patterns the substrate is exposed on an ultra-violet, extreme ultra-violet exposing machine or electron beam exposing machine, then after developing, fixing and post-baking, the magnetic multilayer film is etched into closed shape by ion etching method, and at last, the resist is stripped off by dipping into stripping chemicals;
   4) Depositing 100-1000 nm insulation layer on the etching formed closed magnetic multilayer film of step 3) by conventional film growth method to bury each closed ring shaped multilayer film and separated into different cells;
   5) Preparing a metal core in the geometric center of closed ring multilayer film by micro-fabrication techniques, the shape of the metal core matches with that of the closed magnetic multilayer film, and its cross section is a circular ring or a elliptic ring;
   6) Etching the insulation layer at the position where the closed multilayer film is deposited to expose the magnetic multilayer film buried under the insulation layer, by ultraviolet, extreme ultraviolet lithography or electron beam lithography of micro-fabrication techniques and focusing ion beam etching or chemical reaction dry etching or chemical reaction wet etching, so that the closed magnetic multilayer film with a metal core of present invention is obtained.

18. A magnetic random access memory made of the magnetic multilayer film magnetic memory cells according to claim 14, including:
   Memory reading and writing control unit array composed of transistor units, the reading and writing control unit array being integrated in the semiconductor substrate;
   Memory cells and the array thereof; characterized in: there is a metal core positioned at the geometric center of the magnetic multilayer film of said memory cell, and the cross section of the metal core has corresponding shape;
   A transitional metal layer which connects said transistor units with memory cell of the closed magnetic multilayer film having a metal core;
   And a word line and two bit lines, said word line being also the grid of said transistor, said two bit lines being disposed above said memory cell of closed magnetic multilayer film having a metal core, wherein the first bit line is vertical to said word line, and is directly connected to said memory cell of closed magnetic multilayer film having a metal core, the second bit line connects directly to the metal core in the memory cell of closed magnetic multilayer film having a metal core, and being separated with the first bit line by an insulation layer.

19. The method of accessing the magnetic random access memory of closed magnetic multilayer film of claim 18, which realizes the writing operation of MRAM by the current applied to the metal core in the memory cell RML, and the reading operation of MRAM by the tunneling current applied to the closed magnetic multilayer film in the memory cell RML, the method including the following steps:
   controlling the current flowing through the memory cell of closed magnetic multilayer film having a metal core smaller than the low threshold $I_{C1}$, the magnetic state of bit layer will not change, this the reading operation of MRAM is realized;
   controlling the current flowing through the metal core in the memory cell of closed magnetic multilayer film having the metal core, since the magnetic field created by the current has a ring shaped distribution, the writing operation of MRAM can be realized by control of the magnetic state of the closed magnetic multilayer film, specifically: when the current applied to the metal core in the memory cell RML of closed magnetic multilayer film having the metal core is larger than low threshold $I_{C1}$, and smaller than high threshold $I_{C2}$, the magnetic state of the bit layer in memory cell of closed magnetic multilayer film will be changed by the current direction, and the magnetic states of its bit layer is oriented clockwise or counter-clockwise by the clockwise or counter-clockwise magnetic field created by positive and negative driving current, so that the magnetic states of bit layer and the pinned magnetic layer or hard magnetic layer are same or opposite along the clockwise or counter-clockwise direction, respectively, thus, two states of low and high resistance are obtained, that is to say, the writing operation of MRAM can be realized by control the current direction.

20. A magnetic random access memory of said closed magnetic multilayer film having a metal core according to claim 14, including:
   A memory reading and writing control unit array composed of a first and second transistor unit, the reading and writing control unit array being integrated in the semiconductor substrate; the first transistor switch controls reading operation, the second transistor switch controls writing operation; the grid of the first transistor acts also as the first word line, the grid of the second transistor acts the second word line;
   Memory cell and the array thereof; characterized in: there is a metal core positioned at the geometric center of the magnetic multilayer film of said memory cell, and the cross section of the metal core has corresponding shape;

A first, second and third conductive contact hole are respectively disposed above the common drain of the transistor, the source of the first transistor and the source of the second transistor, and are connected to the transitional metal layer thereon, respectively; the transitional metal layer on the first contact hole also acts as the ground line; the fourth conductive contact hole connects to the third transitional metal layer; said third transitional metal layer acts as bottom conductive electrode which connects to the lower end of said closed magnetic multilayer film having the metal core, the bit line is disposed on the top of closed magnetic multilayer film having the metal core and connected therewith; the upper end of the metal core in the closed magnetic multilayer film having the metal core contacts with the bit line, and the lower end connects to the first transitional metal layer; the fifth insulation layer covers the bit line.

21. The geometric shaped magnetic multilayer film according to claim 14, characterized in that: the magnetic multilayer film whose cross section is elliptic shaped is non-pinning magnetic multilayer film, including a buffering conductive layer, a hard magnetic layer, an intermediate layer, a soft magnetic layer and a capping layer;
said buffering conductive layer is composed of metal materials, and the thickness is 2-200 nm;
said hard magnetic layer is composed of giant magneto resistance materials, and the thickness is 2-20 nm;
said intermediate layer comprising non-magnetic metal layer or insulation potential barrier layer, the thickness of the intermediate layer is 0.5-10 nm;
the component materials of said soft magnetic layer are ferromagnetic materials with high spin polarization and low coercive force, and the thickness of said soft magnetic layer is 1-20 nm;
said capping layer is composed of non-oxidable metal materials, and the thickness is 2-20 nm.

22. The geometric shaped magnetic multilayer film according to claim 21, characterized in that:
the component materials of said buffering conductive layer are Ta, Ru, Cr, Au, Ag, Pt, Ta, W, Ti, Cu, Al, or Si—Al alloys;
the component materials of said hard magnetic layer are Co, Fe, Ni, CoFe, NiFeCo, CoFeB or CoFeSiB;
the non-magnetic metal layer of said intermediate layer is Ti, Zn, ZnMn, Cr, Ru, Cu, V or TiC; said insulation potential barrier layer of the intermediate layer is Al2O3, MgO, TiO, ZnO, (ZnMn)O, CrO, VO, or TiCO;
the component materials of said soft magnetic layer are Co, Fe, Ni or the metal alloys thereof, the alloys are NiFe, CoFeSiB or NiFeSiB, or non-crystal Co100-x-yFexBy, wherein 0<x<100, 0<y≦20, or Co2MnSi, Co2Cr0.6Fe0.4Al;
the component materials of said capping layer are Ta, Cu, Ru, Pt, Ag, Au, Cr or the alloys thereof.

23. The geometric shaped magnetic multilayer film according to claim 14, characterized in that: the closed magnetic multilayer film is pinning magnetic multilayer film, including a buffering conductive layer, an anti-ferromagnetic pinning layer, a pinned magnetic layer, an intermediate layer, a soft magnetic layer and a capping layer;
said buffering conductive layer is composed of metal materials, the thickness is 2-200 nm;
said anti-ferromagnetic pinning layer is composed of anti-ferromagnetic alloys, the thickness is 3-30 nm;
said pinned magnetic layer is composed of ferromagnetic metals of high spin polarization, and the thickness is 2-20 nm;
said intermediate layer is composed of non-magnetic metal layer or insulation potential barrier layer, the thickness of the intermediate layer is 0.5-10 nm;
said soft magnetic layer is composed of ferromagnetic materials of high spin polarizability and low coercive force, and the thickness is 1-20 nm;
said capping layer is composed of non-oxidable metal materials, and the thickness is 2-20 nm.

24. The geometric shaped magnetic multilayer film according to claim 23, characterized in that:
the component materials of said buffering conductive layer are Ta, Ru, Cr, Au, Ag, Pt, Ta, W, Ti, Cu, Al, or Si—Al alloys;
the component materials of said antiferromagnetic pinning layer are IrMn, FeMn, PtMn, CrMn, or Pt (Cr, Mn) alloys;
the component materials of said pinned magnetic layer are Fe, Co, Ni or the alloys thereof;
the non-magnetic metal layer of said intermediate layer is Ti, Zn, ZnMn, Cr, Ru, Cu, V or TiC; said insulation potential barrier layer of the intermediate layer is Al2O3, MgO, TiO, ZnO, (ZnMn)O, CrO, VO, or TiCO;
the component materials of said soft magnetic layer are Co, Fe, Ni or the metal alloys thereof, or non-crystal Co100-x-yFexBy, wherein 0<x<100, 0<y≦20, or NiFeSiB, or Heusler alloys;
the component materials of said capping layer are Ta, Cu, Ru, Pt, Ag, Au, Cr or the alloys thereof.

25. The magnetic multilayer film according to claim 14, characterized in that: said closed magnetic multilayer film is non-pinning closed ring magnetic multilayer film with double intermediate layers, including: a buffering conductive layer, a first hard magnetic layer, a first intermediate layer, a soft magnetic layer, a second intermediate layer, a second hard magnetic layer, and a capping layer;
said buffering conductive layer is composed of metal materials, and the thickness of which is 2-200 nm;
said first and second hard magnetic layers are composed of materials having large giant magneto resistance effect, and the thickness of which is 2-20 nm;
said first and second intermediate layers are composed of non-magnetic metal layer or insulation potential barrier layer, and the thickness of the intermediate layer is 0.5-10 nm;
said soft magnetic layer is composed of ferromagnetic materials having high spin polarizability and low coercive force, and the thickness of which is 1-20 nm;
said capping layer is composed of non-oxidable metal materials, and the thickness is 2-20 nm.

26. The magnetic multilayer film according to claim 25, characterized in that:
the component materials of said buffering conductive layer are Ta, Ru, Cr, Au, Ag, Pt, Ta, W, Ti, Cu, Al, or Si—Al alloys;
the component materials of said first and second hard magnetic layer are Co, Fe, Ni, CoFe, NiFeCo, CoFeB or CoFeSiB;
the non-magnetic metal layer of said first and second intermediate layer are Ti, Zn, ZnMn, Cr, Ru, Cu, V, or TiC; the insulation potential barrier layer of said intermediate layer is Al2O3, MgO, TiO, ZnO, (ZnMn)O, CrO, VO, or TiCO;
the component materials of said soft magnetic layer are Co, Fe, Ni or their metal alloy NiFe, CoFeSiB, NiFeSiB, or non-crystal Co100-x-yFexBy, where 0<x<100, 0<y≦20, or Co2MnSi, Co2Cr0.6Fe0.4Al;

the component materials of said capping layer are Ta, Cu, Ru, Pt, Ag, Au, Cr or the alloys thereof.

27. The magnetic multilayer film according to claim 14, characterized in that: said closed magnetic multilayer film is pinning closed ring magnetic multilayer film with double intermediate layers, including: a buffering conductive layer, a first antiferromagnetic pinning layer, a first pinned magnetic layer, a first intermediate layer, a soft magnetic layer, a second intermediate layer, a second pinned magnetic layer, a second antiferromagnetic pinning layer, and a capping layer;

said buffering conductive layer is composed of metal materials, and the thickness is 2-200 nm;

said first and second anti-ferromagnetic pining layer are both composed of anti-ferromagnetic alloys, the thickness of which is 3-30 nm;

said first and second pinned magnetic layer are composed of ferromagnetic metals with high spin polarizability, and the thickness is 2-20 nm;

said first and second intermediate layer are composed of a non-magnetic metal layer or an insulation potential barrier layer, and the thickness of the intermediate layer is 0.5-10 nm;

said soft magnetic layer is composed of ferromagnetic materials having high spin polarizability and low coercive force, and the thickness is 1-20 nm;

said Capping layer is composed of non-oxidable metal materials, the thickness of which is 2-20 nm.

28. The magnetic multilayer film according to claim 27, characterized in that:

the component materials of said buffering conductive layer are Ta, Ru, Cr, Au, Ag, Pt, Ta, W, Ti, Cu, Al, or Si—Al alloys;

the component materials of said first and second anti-ferromagnetic pinning layer are IrMn, FeMn, PtMn, CrMn or Pt (Cr, Mn) alloys;

the component materials of said first and second pinned magnetic layer are Fe, Co, Ni or the alloys thereof;

the component materials of the non-magnetic metal layer of said first and second intermediate layer are Ti, Zn, ZnMn, Cr, Ru, Cu, V or TiC; the component materials of the insulation potential barrier layer of said intermediate layer are Al2O3, MgO, TiO, ZnO, (ZnMn)O, CrO, VO, or TiCO;

the component materials of said soft magnetic layer are Co, Fe, Ni or the alloys thereof, or non-crystal Co100-x-yFexBy, wherein $0<x<100$, $0<y\leqq20$, or NiFeSiB, or Heusler alloys;

the component materials of said capping layer are Ta, Cu, Ru, Pt, Ag, Au, Cr, or the alloys thereof.

29. A geometric shaped magnetic multilayer film, including each layer of a conventional magnetic multilayer film deposited on a substrate, characterized in that: the cross section of said magnetic multilayer film is a closed elliptic ring, the magnetic moment or flux of the ferromagnetic thin film in the magnetic multilayer film is in clockwise or counter-clockwise closed state; wherein the interior minor axis of the elliptic ring shaped magnetic multilayer's cross section is 10-100000 nm, the ratio of minor axis vs. major axis is 1:1-1:5, the exterior minor axis of the ellipse is 20-200000 nm, the width of the ring is 10-100000 nm, said magnetic multilayer film is non-pinning closed ring magnetic multilayer film with double intermediate layers, including a buffering conductive layer, a first hard magnetic layer, a first intermediate layer, a soft magnetic layer, a second intermediate layer, a second hard magnetic layer, and a capping layer;

said buffering conductive layer is composed of metal materials, and the thickness of which is 2-200 nm;

said first and second hard magnetic layers are composed of materials having large giant magneto resistance effect, and the thickness of which is 2-20 nm;

said first and second intermediate layers are composed of non-magnetic metal layer or insulation potential barrier layer, and the thickness of the intermediate layer is 0.5-10 nm;

said soft magnetic layer is composed of ferromagnetic materials having high spin polarizability and low coercive force, and the thickness of which is 1-20 nm; and said capping layer is composed of non-oxidable metal materials, and the thickness is 2-20 nm.

\* \* \* \* \*